(12) United States Patent
Rexberg et al.

(10) Patent No.: US 9,385,764 B2
(45) Date of Patent: Jul. 5, 2016

(54) DIGITAL PRE-DISTORTION FOR HIGH BANDWIDTH SIGNALS

(71) Applicant: Telefonaktiebolaget L M Ericsson (publ), Stockholm (SE)

(72) Inventors: Leonard Rexberg, Hässelby (SE); Håkan Malmqvist, Skarpnäck (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 14/651,920

(22) PCT Filed: Dec. 13, 2012

(86) PCT No.: PCT/SE2012/051386
§ 371 (c)(1),
(2) Date: Jun. 12, 2015

(87) PCT Pub. No.: WO2014/092617
PCT Pub. Date: Jun. 19, 2014

(65) Prior Publication Data
US 2015/0318880 A1 Nov. 5, 2015

(51) Int. Cl.
*H04K 1/02* (2006.01)
*H04L 25/03* (2006.01)
(Continued)

(52) U.S. Cl.
CPC ............ *H04B 1/0475* (2013.01); *H03F 1/3247* (2013.01); *H03F 3/24* (2013.01); *H04L 27/368* (2013.01); *H03F 2201/3233* (2013.01); *H04B 2001/045* (2013.01); *H04B 2001/0425* (2013.01)

(58) Field of Classification Search
CPC .......... H04B 1/0475; H04B 2001/045; H04B 2001/0425; H04B 27/368; H03F 1/3247; H03F 3/24; H03F 2201/3233; H04L 27/368
USPC ............... 375/297, 296, 285, 346; 455/114.2, 455/114.3, 114.1
See application file for complete search history.

(56) References Cited

U.S. PATENT DOCUMENTS 5,049,832 A 9/1991 Cavers
5,937,011 A 8/1999 Carney et al.
(Continued)

FOREIGN PATENT DOCUMENTS

EP 1732207 A1 12/2006
WO 0039920 A1 7/2000

OTHER PUBLICATIONS

Ding, Lei et al., "A Memory Polynomial Predistorter Implemented Using TMS320C67XX", Proc. Texas Instruments Developer Conference, Houston, TX, Feb. 2004, 1-7.
(Continued)

*Primary Examiner* — Phuong Phu
(74) *Attorney, Agent, or Firm* — Murphy, Bilak & Homiller, PLLC

(57) ABSTRACT

A digital pre-distortion arrangement is disclosed. The arrangement comprises a respective filter bank for each of two or more initial signals to be amplified simultaneously by a non-linear power amplifier, N combiners, N pre-distorters and a multiplexer. Each respective filter bank comprises N interrelated filters. Multiplexed impulse responses of the interrelated filters define an overall filter function comprising a pass band associated with a transmission frequency of the initial signal. Each respective filter bank is configured to filter the respective initial signal in each of the interrelated filters to produce N digital filtered signals. The initial signal and each of the digital filtered signals have sample rate R. Each of the combiners is configured to combine corresponding digital filtered signals of each of the two or more initial signals to produce a composite digital signal having sample rate R. Each of the pre-distorters is configured to apply digital pre-distortion at a processing rate R to a respective one of the composite digital signals to produce a pre-distorted composite digital signal having sample rate R. The multiplexer is configured to multiplex the N pre-distorted composite digital signals to produce a pre-distorted digital signal having a sample rate N times R, wherein the pre-distorted digital signal comprises a signal component of each of the two or more initial signals and N times R is greater or equal to a total bandwidth comprising the transmission frequencies of the two or more initial signals. Corresponding method, transmitter and wireless communication device are also disclosed.

25 Claims, 11 Drawing Sheets

(51) Int. Cl.
*H04L 25/49* (2006.01)
*H04B 1/04* (2006.01)
*H03F 1/32* (2006.01)
*H03F 3/24* (2006.01)
*H04L 27/36* (2006.01)

(56) References Cited

U.S. PATENT DOCUMENTS

| | | | |
|---|---|---|---|
| 7,106,806 B1* | 9/2006 | Kenington | H03F 1/3258 330/278 |
| 8,019,015 B2 | 9/2011 | Moffatt et al. | |
| 8,391,809 B1 | 3/2013 | Fuller et al. | |
| 2001/0014592 A1 | 8/2001 | Helms et al. | |
| 2001/0054974 A1* | 12/2001 | Wright | H03H 11/04 341/144 |
| 2003/0053552 A1 | 3/2003 | Hongo et al. | |
| 2006/0240786 A1* | 10/2006 | Liu | H03F 1/3247 455/114.3 |
| 2013/0243123 A1* | 9/2013 | Bai | H04L 27/367 375/297 |
| 2014/0009225 A1* | 1/2014 | Laporte | H03F 1/3247 330/103 |
| 2014/0139286 A1* | 5/2014 | Laporte | H03F 1/3247 330/149 |
| 2015/0092880 A1* | 4/2015 | Johansson | H04B 1/04 375/295 |
| 2015/0236731 A1* | 8/2015 | Ghannouchi | H04B 1/0475 375/296 |

OTHER PUBLICATIONS

Lopez-Valcarce, Roberto et al., "Toward a Theory of Multirate Nonlinear Systems", IEEE 7th Workshop on Signal Processing Advances in Wireless Communications, Cannes, France, Jul. 2006, 1-5.

Hammi, Oualid et al., "Digital Subband Filtering Predistorter Architecture for Wireless Transmitters", IEEE Transactions on Microwave Theory and Techniques, vol. 53, No. 5, May 2005, 1643-1652.

Harris, Fredric J. et al., "Digital Receivers and Transmitters Using Polyphase Filter Banks for Wireless Communications", IEEE Transactions on Microwave Theory and Techniques, vol. 51, No. 4, Apr. 2003, 1395-1412.

* cited by examiner

DIGITAL PRE-DISTORTION FOR HIGH BANDWIDTH SIGNALS

TECHNICAL FIELD

The present invention relates generally to the field of digital pre-distortion. More particularly, it relates to digital pre-distortion for multiple signals of different carrier frequencies.

BACKGROUND

Commonly in signal transmission systems, a signal to be transmitted is amplified before transmission. In a typical application a power amplifier (e.g. a radio frequency power amplifier) is used for the amplification. In many implementations, the power amplifier may have non-linear characteristics. For example, the power amplifier may be non-linear with regard to envelope and/or phase.

One way to counteract the effect of non-linear characteristics is to apply digital pre-distortion (DPD) to the signal before it is amplified. The digital pre-distortion may typically be adapted to represent an inverse characteristic of the non-linearity to be counteracted such that the combined effect of the digital pre-distortion and the non-linear amplification results in a linear (or close to linear) amplification.

Various digital pre-distortion methods are well known in the art. Typically, a digital pre-distortion arrangement comprises an actuator part in a forward signal processing path. The actuator applies a correction to the signal intended for amplification and transmission. In addition to the forward processing path, a digital pre-distortion arrangement may comprise a feedback path from the output of the amplifier to an adaptor, where the signal output of the amplifier is compared to the non-predistorted signal. The adaptor typically produces correction parameters, which are then fed to the actuator. This enables the actuator to follow variations in the non-linear characteristics of the amplifier and/or to correct discrepancies of the inverse characteristic.

FIG. 1 illustrates an example arrangement for adaptive digital pre-distortion. A similar arrangement is also disclosed in U.S. Pat. No. 5,049,832, which is referred to for further details and examples.

The adaptive digital pre-distortion arrangement of FIG. 1 has a forward processing path 101 and a feedback processing path 102.

A signal intended for transmission is input to a DPD actuator 110 in the forward processing path 101 and the output of the DPD actuator is fed to a power amplifier (PA) 120 for amplification before transmission. The DPD actuator comprises an envelope extractor (ENV) 111, a look-up table (LUT) 112 and a signal combiner (e.g. a mixer) 113. The envelope extractor 111 determines the envelope of the signal intended for transmission and uses the determined envelop value for addressing the look-up table 112. Based on the determined envelope, the look-up table outputs a compensation signal adapted to counteract any non-linearity of the power amplifier 120. The compensation signal is combined with the signal intended for transmission by the signal combiner 113 to produce the output of the DPD actuator 110.

The signal intended for transmission is also input to a DPD adaptation arrangement 130 in the feedback path 102. Also input to the DPD adaptation arrangement 130 is a feedback signal from the output of the power amplifier 120. The DPD adaptation arrangement comprises a delay arrangement 131 and an adaptor 132. The signal intended for transmission is delayed in the delay arrangement 131 (preferably to match the timing of the feedback signal) and compared with the feedback signal in the adaptor 132. The comparison results in a correction signal being output from the DPD adaptation arrangement. The correction signal is used for updating the look-up table 112 as required to improve the linearization properties of the digital pre-distortion.

"Toward a theory of multirate nonlinear systems" by Roberto Lopez-Valcare and Soura Dasgupta, Proc. 2006 Signal Processing Advances for Wireless Communications Workshop (SPAWC'06), Cannes, France, 2006 discloses another example arrangement for digital pre-distortion. The arrangement of this disclosure is without feedback path. In one example, the arrangement uses a poly-phase implementation.

"A memory polynomial predistorter implemented using TMS320C67xx" by L. Ding, H. Qian, N. Chen and G. T. Zhou, Proc. Texas Instruments Developer Conference, Houston, Tex., February 2004 discloses yet another example arrangement for digital pre-distortion. The arrangement of this disclosure comprises a feedback path for adaptation of the pre-distorter.

In applications where two or more signals that are widely separated in frequency are to be amplified simultaneously, the implementation of traditional digital pre-distortion may be cumbersome (or even impossible with the hardware solutions currently available) as will be explained in the following. One example of such an application is when the respective carriers of the two or more signals are in different frequency bands.

Digital pre-distortion is a digital signal process using sampled signals. The sampling rate (signal processing bandwidth) that is necessary to adequately carry out the digital pre-distortion depends on the frequency bandwidth that should be covered by the process. For example, applications with complex signals (i.e. using in-phase I and quadrature Q components) requires a sampling rate that is at least as high as the applicable signal bandwidth according to the Nyquist sampling theorem.

Thus, when two or more signals that are widely separated in frequency are subject of digital pre-distortion, a high sampling rate is required to cover the instantaneous signal bandwidth (IBW). The instantaneous signal bandwidth is defined as the total bandwidth encompassing all the carriers intended for transmission.

In some applications it is also required to cover one, several or all intermodulation (IM) products of the two or more signals to properly implement the digital pre-distortion. For example, to be able to handle third order intermodulation products for carriers contained within 20 MHz, the required signal processing speed (sampling rate) is 3×20=60 MHz, and for fifth order intermodulation products the required signal processing speed is 5×20=100 MHz. When a signal to be transmitted comprises multiple carrier bands separated by a significant frequency span (e.g. 10-100 times the channel bandwidth), covering the intermodulation products of each carrier band and possibly also inter-band intermodulation products of the carrier bands may be required to properly implement the digital pre-distortion. Hence, the sampling rate has to be even higher in such applications to encompass the instantaneous signal bandwidth and the intermodulation products that are to be reduced by the digital pre-distortion process. For example, a signal including simultaneous transmission in Third Generation Partnership Project (3GPP) Band 1 (2110-2170 MHz) and Band 7 (2620-2690) has a maximum frequency span (instantaneous signal bandwidth) of 2690−2110=580 MHz. To handle third order intermodulation products between the two bands, a sampling rate of at least 3×580=1740 MHz would be required in the digital pre-distortion processing.

Hence, a very high sampling rate (in some situations in the same order as radio frequencies) may be required to properly implement the digital pre-distortion. A very high sampling rate is typically not possible to accommodate in currently available hardware implementations (e.g. a field-programmable gate array (FPGA) or an application specific integrated circuit (ASIC)).

One solution would be to process the relevant frequency bands separately and calculate cross terms for pre-distortion of the combined carriers. Such a solution, however, require extra digital processing (which may be costly) and will not be able to handle inter-band intermodulation products.

Therefore, there is a need for methods and arrangements for digital pre-distortion of multiple signals having different carrier frequencies.

SUMMARY

It should be emphasized that the term "comprises/comprising" when used in this specification is taken to specify the presence of stated features, integers, steps, or components, but does not preclude the presence or addition of one or more other features, integers, steps, components, or groups thereof.

It is an object of some embodiments to obviate at least some of the above disadvantages and to provide methods and arrangements for digital pre-distortion of multiple signals having different carrier frequencies.

According to a first aspect, this is achieved by a digital pre-distortion method for counteracting distortion of a non-linear power amplifier amplifying two or more initial signals simultaneously.

The transmission frequencies of the two or more initial signals may typically be different. In some embodiments, the transmission frequencies of the two or more initial signals are comprised in at least two different frequency bands.

The method comprises, for each of the two or more initial signals to be amplified simultaneously by the non-linear power amplifier, filtering the initial signal in each of a first number, N, of interrelated filters of a respective filter bank to produce a second number, N, of digital filtered signals. The initial signal and each of the digital filtered signals have a first sample rate, R. The interrelated filters are configured so that multiplexed impulse responses of the interrelated filters of the respective filter bank define an overall filter function comprising a pass band associated with the transmission frequency of the initial signal. For example, the overall filter function may comprise a pass band associated with a transmission bandwidth of the initial signal.

The method also comprises combining corresponding digital filtered signals of each of the two or more initial signals to produce a third number, N, of composite digital signals having a second sample rate R, applying digital pre-distortion at a processing rate, R, to each of the composite digital signals to produce a fourth number, N, of pre-distorted composite digital signals having third sample rate, R, and multiplexing the N pre-distorted composite digital signals having the third sample rate, R, to produce a pre-distorted digital signal having a fourth sample rate, N times R. The pre-distorted digital signal comprises a signal component of each of the two or more initial signals. The pre-distorted digital signal may, according to some embodiments, be suitable as input signal to the power amplifier after conversion to an analog domain.

The first, second, third and fourth numbers, N, are equal and N is an integer larger than 1. The processing rate, R, and the first, second and third sample rates, R, are equal, and the fourth sample rate, N times R, is greater or equal to a total bandwidth comprising the transmission frequencies of the two or more initial signals. For example, the fourth sample rate may be greater or equal to a total bandwidth comprising the transmission bandwidths of the two or more initial signals.

According to some embodiments, each of the respective filter banks comprises a poly-phase filter structure and each of the N signal paths may be termed a poly-phase path. For example, each of the N interrelated filters may comprise one or more taps of the overall filter function. In some embodiments, the overall filter function is defined at sampling rate N times R with M filter taps. Then, the first interrelated filter may be defined at sampling rate R and comprise taps 1, N+1, 2N+2, etc of the overall filter function, the second interrelated filter may be defined at sampling rate R and comprise taps 2, N+2, 2N+2, etc of the overall filter function, and so on until the $N^{th}$ interrelated filter, which may be defined at sampling rate R and comprise taps N, 2N, 3N, etc of the overall filter function.

In some embodiments, the filtering in combination with the multiplexing has an up-conversion effect on the initial signal. This up-conversion effect on the initial signal may render further up-conversion (e.g. in the analog domain after digital-to-analog conversion in a fast analog-to-digital converter) obsolete as will be seen in some of the following embodiments. This technology is called direct RF.

That the pass band is associated with the transmission frequency of the initial signal may, according to some embodiments, imply that the overall filter function passes signals in a frequency range including the transmission frequency while it blocks other signals. For example, the pass band may comprise (e.g. be centered around) the transmission frequency of the corresponding initial signal and/or a folded/mirrored version of the transmission frequency.

In some embodiments, the combining may comprise adding the digital filtered signals. Corresponding digital filtered signals may refer to digital filtered signals of the same poly-phase path for each of the initial signals. For example, the outputs of the first interrelated filter for each initial signal may be combined, the outputs of the second interrelated filter for each initial signal may be combined, etc.

The digital pre-distortion of each composite digital signal (e.g. of each poly-phase path) may be completely independent of the digital pre-distortion of the other composite digital signals in some embodiments.

The pre-distortion function applied to each composite digital signal may be the same or may differ between each composite digital signal. In some embodiments, the pre-distortion is a function of a signal level of the composite digital signal. The pre-distortion function may, for example be embodied in one or more look-up tables or databases. A look-up table or database may be shared by several composite digital signals or may be individual for each composite digital signal. The pre-distortion function may be static or adaptive. The signal level of the composite digital signal may be used to address the look-up table or database.

The multiplexing may comprise selecting samples of the N pre-distorted composite digital signals in sequence. The multiplexer may be performed in a sequencer.

In some embodiments, the method further comprises digital-to-analog converting the pre-distorted digital signal to a pre-distorted analog signal and amplifying the pre-distorted analog signal in the non-linear power amplifier to produce an amplified signal. If the pre-distorted analog signal does not have an appropriate frequency, the method may further comprise mixing the pre-distorted analog signal with a first radio frequency modulation signal to produce a radio frequency pre-distorted analog signal before amplification. One possible definition of an appropriate frequency may be that each signal component (in the pre-distorted analog signal) is located at the transmission frequency of the respective initial signal.

The method may further comprise transmitting the amplified signal over a transmission medium according to some embodiments.

In some embodiments, each of the two or more initial signals may be a baseband signal. The method may, according to some embodiments, further comprise mixing each of the two or more initial signals with a respective positioning frequency before filtering the initial signal. This operation may enable positioning the initial signal such that the corresponding carrier will appear at an appropriate frequency (e.g. the transmission frequency or a frequency related thereto) in the resulting analog signal (e.g. the pre-distorted analog signal with or without mixing with a radio frequency modulation signal).

According to some embodiments, the method further comprises delaying each of the initial signals to produce delayed initial signals, comparing the delayed initial signals with a digital feedback signal to produce a pre-distortion error estimation, wherein the digital feedback signal represents the pre-distorted digital signal influenced by the non-linear power amplifier, and adapting the digital pre-distortion based on the pre-distortion error estimation. For example, the pre-distortion error estimation may be produced as or based on a difference between the compared signals. Adapting the digital pre-distortion may, for example, comprise updating a pre-distortion look-up table or database.

Comparing the delayed initial signals with a digital feedback signal may comprise mixing each of the delayed initial signals with a respective feedback positioning frequency to produce respective frequency shifted delayed initial signals and combining the respective frequency shifted delayed initial signals to produce a composite reference signal.

Comparing the delayed initial signals with a digital feedback signal may further comprise (for each transmission frequency of the two or more initial signals) filtering the digital feedback signal with a respective receiver filter to produce a filtered feedback signal, and mixing the filtered feedback signal with the respective feedback positioning frequency to produce a frequency shifted baseband feedback signal.

Comparing the delayed initial signals with a digital feedback signal may also comprise combining the frequency shifted baseband feedback signals to produce a composite feedback signal and comparing the composite reference signal with the composite feedback signal to produce the pre-distortion error estimation.

Adapting the digital pre-distortion based on the pre-distortion error estimation may comprise determining correction parameters based on the pre-distortion error estimation and adapting the digital pre-distortion based on the correction parameters.

Mixing with a respective feedback positioning frequency enable positioning of the delayed initial and feedback signals such that signals relating to the same initial signal are located in the same frequency position while signals relating to different initial signals are located in different frequency positions.

The respective receive filter may pass the frequencies of some of the intermodulation products (e.g. up to the third order) around the transmission frequency according to some embodiments.

A second aspect is a digital pre-distortion arrangement comprising a respective filter bank for each of two or more initial signals to be amplified simultaneously by a non-linear power amplifier, N combiners, N pre-distorters and a multiplexer.

Each respective filter bank comprises N interrelated filters. Multiplexed impulse responses of the interrelated filters define an overall filter function comprising a pass band associated with a transmission frequency of the initial signal. Each respective filter bank is configured to filter the respective initial signal in each of the interrelated filters to produce N digital filtered signals. The initial signal and each of the digital filtered signals have sample rate R.

Each of the combiners is configured to combine corresponding digital filtered signals of each of the two or more initial signals to produce a composite digital signal having sample rate R.

Each of the pre-distorters is configured to apply digital pre-distortion at a processing rate R to a respective one of the composite digital signals to produce a pre-distorted composite digital signal having sample rate R.

The multiplexer is configured to multiplex the N pre-distorted composite digital signals to produce a pre-distorted digital signal having a sample rate N times R, wherein the pre-distorted digital signal comprises a signal component of each of the two or more initial signals and N times R is greater or equal to a total bandwidth comprising the transmission frequencies of the two or more initial signals.

The arrangement may, according to some embodiments, further comprise a digital-to-analog converter configured to convert the pre-distorted digital signal to a pre-distorted analog signal and the non-linear power amplifier may be configured to amplify the pre-distorted analog signal in the non-linear power amplifier to produce an amplified signal. In some embodiments, the arrangement may even further comprise a mixer configured to mix the pre-distorted analog signal with a first radio frequency modulation signal before amplification.

The arrangement may also comprise a mixer for each of the two or more initial signals according to some embodiments, each mixer configured to mix the initial signal with a respective positioning frequency before filtering of the initial signal.

In some embodiments, the arrangement comprises one or more delay elements configured to delay each of the initial signals to produce delayed initial signals and an adaptor configured to compare the delayed initial signals with a digital feedback signal to produce a pre-distortion error estimation, wherein the digital feedback signal represents the pre-distorted digital signal influenced by the non-linear power amplifier, and to adapt the digital pre-distortion based on the pre-distortion error estimation.

The adaptor may, according to some embodiments, comprise a mixer for each of the two or more initial signals configured to mix the delayed initial signal with a respective feedback positioning frequency to produce a respective frequency shifted delayed initial signal, a combiner configured to combine the respective frequency shifted delayed initial signals to produce a composite reference signal, a respective receive filter for each of the two or more initial signals, the respective filter configured to filter the digital feedback signal to produce a respective filtered feedback signal, a mixer for each of the two or more initial signals configured to mix the filtered feedback signal with the respective feedback positioning frequency to produce a frequency shifted baseband feedback signal, a combiner configured to combine the frequency shifted baseband feedback signals to produce a composite feedback signal, and a comparator configured to compare the composite reference signal with the composite feedback signal to produce the pre-distortion error estimation.

The adaptor may further comprise a determiner configured to determine correction parameters based on the pre-distortion error estimation and a pre-distorter controller configured to adapt operation of the N pre-distorters based on the correction parameters.

In some embodiments, the arrangement may further comprise an analog-to-digital converter configured to convert an analog feedback signal representing the pre-distorted digital signal influenced by the non-linear power amplifier to the digital feedback signal.

The arrangement may also comprise a mixer configured to mix the analog feedback signal with a second radio frequency modulation signal before converting it to the digital feedback signal.

A third aspect is a transmitter comprising the arrangement of the second aspect.

A fourth aspect is a wireless communication device comprising the arrangement of the second aspect.

In some embodiments, the second, third and fourth aspects may additionally have features identical with or corresponding to any of the various features as explained above for the first aspect.

According to some aspects, methods and arrangements for digital pre-distortion of multiple signals having different carrier frequencies are provided by application of the feedback path as described above.

Thus, a fifth aspect is a digital pre-distortion adaption method comprising delaying two or more initial signals to be amplified simultaneously by a non-linear power amplifier to produce delayed initial signals, wherein each of the initial signals has sample rate R, mixing each of the delayed initial signals with a respective feedback positioning frequency to produce respective frequency shifted delayed initial signals and combining the respective frequency shifted delayed initial signals to produce a composite reference signal. The method also comprises (for each transmission frequency of the two or more initial signals) filtering a digital feedback signal with a respective receiver filter having a pass band associated with the transmission frequency to produce a filtered feedback signal, wherein the digital feedback signal represents a pre-distorted digital signal influenced by the non-linear power amplifier, converting the filtered feedback signal to a baseband feedback signal, and mixing the baseband feedback signal with the respective feedback positioning frequency to produce a frequency shifted baseband feedback signal. The method further comprises combining the frequency shifted baseband feedback signals to produce a composite feedback signal, comparing the composite reference signal with the composite feedback signal to produce a pre-distortion error estimation, and adapting the digital pre-distortion based on the pre-distortion error estimation.

A sixth aspect is a digital pre-distortion adaption arrangement. The arrangement comprises one or more delay elements configured to delay each of two or more initial signals to be amplified simultaneously by a non-linear power amplifier to produce delayed initial signals, wherein each of the initial signals has sample rate R, and an adaptor configured to compare the delayed initial signals with a digital feedback signal to produce a pre-distortion error estimation, wherein the digital feedback signal represents a pre-distorted digital signal influenced by the non-linear power amplifier. The adaptor comprises a mixer for each of the two or more initial signals configured to mix the delayed initial signal with a respective feedback positioning frequency to produce a respective frequency shifted delayed initial signal, a combiner configured to combine the respective frequency shifted delayed initial signals to produce a composite reference signal, a respective receive filter for each of the two or more initial signals, the respective filter configured to filter the digital feedback signal to produce a respective filtered feedback signal, a mixer for each of the two or more initial signals configured to mix the filtered feedback signal with the respective feedback positioning frequency to produce a frequency shifted baseband feedback signal, a combiner configured to combine the frequency shifted baseband feedback signals to produce a composite feedback signal, and a comparator configured to compare the composite reference signal with the composite feedback signal to produce the pre-distortion error estimation. The adaptor is further adapted to adapt the digital pre-distortion based on the pre-distortion error estimation.

A seventh aspect is a transmitter comprising the arrangement of the sixth aspect.

An eighth aspect is a wireless communication device comprising the arrangement of the sixth aspect.

Some embodiments may be particularly useful in telecommunication systems (for example applying one or more cellular communication standard such as Global System for Mobile communications (GSM), Universal Mobile Telecommunication System (UMTS), UMTS-Long Term Evolution (UMTS LTE)). However, embodiments may be equally applicable also for other systems or standards.

An advantage of some embodiments is that pre-distortion of very wide bandwidths may be achieved without the need for a correspondingly high processing speed of the pre-distorter. For example, two signals to be transmitted on different frequency bands that are widely separated in frequency may be jointly pre-distorted at a moderate processing speed (e.g. a fraction of the Nyquist frequency) of the pre-distorter.

Another advantage of some embodiments is that intermodulation products (e.g. inter-band intermodulation products) may be accounted for in the pre-distortion, even though a moderate processing speed is used.

Yet another advantage of some embodiments is that a simple, economic and straight-forward implementation is provided.

BRIEF DESCRIPTION OF THE DRAWINGS

Further objects, features and advantages will appear from the following detailed description of embodiments, with reference being made to the accompanying drawings, in which.

DETAILED DESCRIPTION

Figure 1:
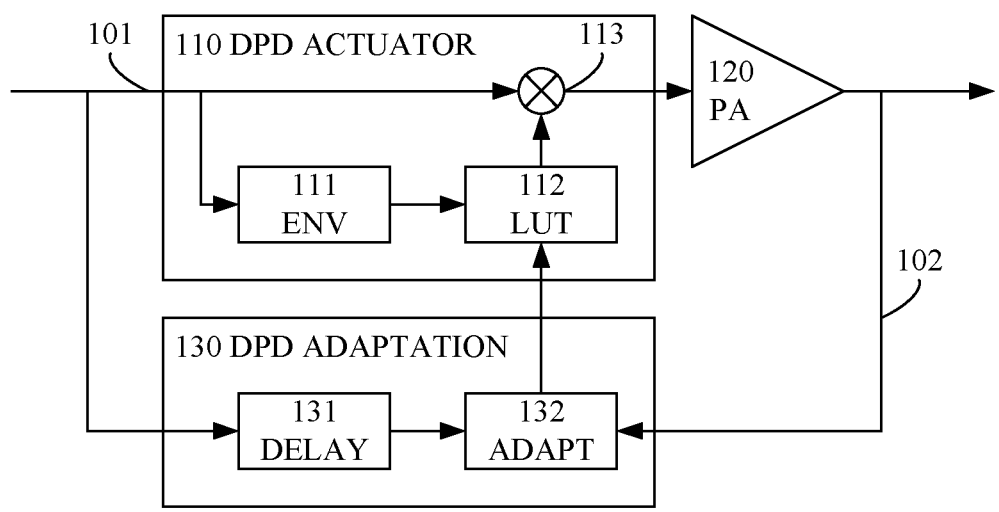
FIG. 1 is a block diagram illustrating a prior art pre-distortion arrangement.

In the following, embodiments will be described where digital pre-distortion may be applied to high bandwidth signals (e.g. multiple frequency band signals) without requiring use of an accordingly high processing speed and sampling rate. Various embodiments will demonstrate that the possibility of using a processing speed (and sampling rate) which is substantially lower than the Nyquist rate of the signal to be pre-distorted may be available for any or both of a forward processing path and a feedback path of a pre-distortion arrangement.

According to some embodiments, a forward processing path may use a poly-phase filter structure for each signal component of the high bandwidth signal to be pre-distorted. The signal components may comprise two or more initial signals or initial signal components. For example, a poly-phase filter structure may be used for each applicable frequency band or for each applicable carrier. In some embodiments, frequency bands that are close in frequency may share a poly-phase filter structure, while frequency bands that are distant in frequency may not share poly-phase filter structure. Poly-phase filter structures are well known in the art and will not be elaborated on in detail.

The output of each poly-phase filter structure comprises a number of filtered signals, one for each phase of the poly-phase filter. Corresponding filtered signals (i.e. the signals having the same phase) from the different poly-phase filter structures may then be combined (e.g. added) so that a number of composite signals are produced, one for each phase of the poly-phase filter structures.

The signal in each poly-phase path may then be processed individually to achieve a proper pre-distortion. Any suitable (known or future) pre-distortion method may be applied to each poly-phase path. The different paths may apply the same or different pre-distortion methods. If the same pre-distortion method is applied, the different paths may apply the same or different parameters of the method.

After the pre-distortion has been applied, the pre-distorted signals of each poly-phase path are serialized. For example, a multiplexer, commutator or sequencer may be applied to sequentially select one sample from each poly-phase path. That is, if the sample sequence of the $n^{th}$ poly-phase path is expressed as $s_n(1), s_n(2), \ldots$, the sample sequence of the sequencer output would be expressed as $s_1(1), s_2(1), s_3(1), \ldots, s_1(2), s_2(2), s_3(2), \ldots$. The serialization of the poly-phase signals also represents an up-sampling. In some embodiments, this will be an up-sampling to the transmission frequency. In other embodiments, a further up-conversion is needed to position the signal at the appropriate transmission frequency.

The serialized signal may typically be converted to the analog domain and input to a power amplifier to produce a signal suitable for transmission.

The use of poly-phase filter structures enables a reduction in the processing speed for the involved components (e.g. the pre-distorter) from the Nyquist rate of the signal to be transmitted to a lower processing rate. The rate reduction corresponds to the number of poly-phase paths applied.

By combining the outputs from several poly-phase filter structures before the pre-distorters (e.g. DPD actuators), it is possible to encompass e.g. carriers in several widely separated frequency bands. Placing the pre-distorters after the combining of outputs from the poly-phase filters, enables inclusion of inter-band intermodulation pre-distortion components over a much wider bandwidth than that of each poly-phase processing path individually.

According to some embodiments, a feedback path uses the transmitted signal as a feedback signal and compares the feedback signal with a properly delayed version of the initial signals before pre-distortion to determine whether or not the pre-distortion is appropriate, and to adapt the pre-distortion if it is not appropriate. Any known or future suitable comparison and adaptation method may be used, and the details thereof will not be described herein.

To make the comparison and adaptation as economical (e.g. in terms of processing speed and sampling rate) and yet as correct as possible, the various signal components of the initial signal, including the intermodulation products that are to be taken into account in the comparison, may be positioned in frequency in relation to each other such that they are close in frequency and yet not overlapping. The signal positioning is typically, but no necessarily, performed at as low frequencies as possible (e.g. baseband). The same frequency positioning may be applied to components of the feedback signal.

Before frequency positioning, the initial signals are diverted from the forward processing path and delayed. The delay may preferably be such that the timing of the signals to be compared is matched. The delayed signal of each initial signal component is then positioned in frequency in relation to the other delayed signals as described above, and the frequency positioned signals are combined to a composite reference signal.

The feedback signal is compared with the delayed and frequency positioned initial signals after conversion to the digital domain. Each relevant signal component of the feedback signal (i.e. each component corresponding to a component of the initial signal) is extracted from the feedback signal, for example via a receiver filter, positioned in frequency in the same manner as the delayed initial signals, and combined to a composite feedback signal.

Then, the composite feedback signal may be compared with the composite reference signal to determine whether or not the pre-distortion is appropriate, and to adapt the pre-distortion if required.

The possibility to compactly position in frequency the signals to be compared enables the involved processing units (e.g. the comparator) to run at a moderate processing speed (and the signals to have corresponding moderate sampling rate) instead of a processing speed corresponding to the Nyquist rate of the transmitted signal. The feedback signal typically only need to encompass some of the intermodulation products (e.g. up to the third order) around the transmitted carriers or frequency bands, but none of the inter-band intermodulation products. By positioning the signal components in a reference frequency configuration as described above, the processing bandwidth needed in the adaptive calculating parts (e.g. the comparator) is only the combined filtered bandwidths of the used frequency bands.

The forward processing path may be applied with or without any feedback path. If a feed back path is applied, it may be according to what is described herein or according to any other suitable feedback path structure for adaptation of the pre-distortion.

Similarly, the feedback path structure described herein may be used with any suitable forward processing path for digital pre-distortion. Hence, the feedback path structure described herein is not limited to use in combination with the forward processing structure described herein.

Thus, a complete digital pre-distortion solution is provided that is suitable for linearizing a power amplifier of a multi band radio transmitter. The proposed architecture may reduce intermodulation distortion in a wide frequency range, encompassing also inter-band intermodulation products, while using a relatively low sampling rate and processing speed. In some embodiments, an architecture comprises a forward path poly-phase filter structure for each frequency band used for transmission, combiners for adding filtered signals of the frequency bands for each poly-phase path, identical DPD actuators in each poly-phase path, and a sequencer for completing the up-sampling. Some embodiments apply this structure together with a feedback path with DPD adaptation using a limited bandwidth reference frequency configuration encompassing only an accumulated bandwidth of the used frequency bands.

Figure 2A:
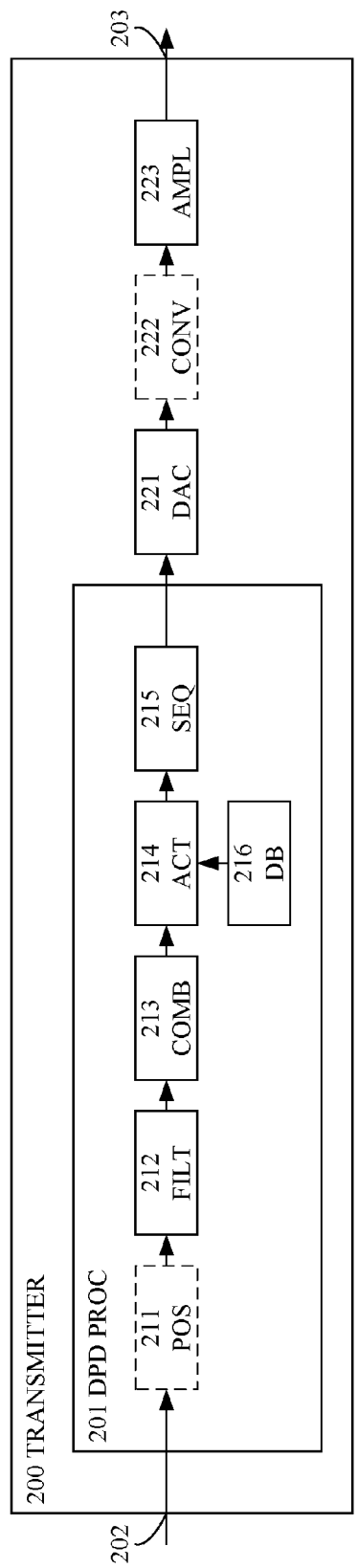
FIG. 2A is a block diagram illustrating an example pre-distortion arrangement according to some embodiments.

FIG. 2A illustrates an example pre-distortion processing arrangement (DPD PROC) 201 that may be comprised in a transmitter 200. The pre-distortion processing arrangement 201 comprises a filter arrangement (FILT) 212, a combiner (COMB) 213, a pre-distorter such as an actuator (ACT) 214, a database (DB) 216, a sequencer (SEQ) 215, and optionally a frequency positioner (POS) 211. The transmitter 200 comprises the pre-distortion processing arrangement 201, a digital-to-analog converter (DAC) 221, an amplifier (AMPL) 223, and optionally an up-converter (CONV) 222.

An input signal 202 that comprises two or more initial signals (signal components) to be transmitted (e.g. in widely separated frequency bands) is input to the pre-distortion processing arrangement 201 of the transmitter 200. Each signal component is filtered in a respective filter of the filtering arrangement 212. The respective filter may be a filter bank comprising a number, N, of interrelated filters, for example, a poly-phase filter structure.

The signal components may be positioned in respective frequency positions in the frequency positioner 211 before being input to the filtering arrangement 212. For example, the frequency positioning may be adapted such that the combined effect of the frequency positioning in 211, the filtering in 212, the sequencing in 215 and the up-conversion in 222 places the resulting signal component of the transmitted signal at the appropriate transmission frequency. Thus, the frequency positioner 211 may fine tune the frequency position of each signal component such that it is offset in relation to a zero frequency by an amount that equals an offset between the transmission frequency of the signal component and a closest multiple of $F_s/N$, where $F_s$ represents the sampling rate of the DAC.

The combiner 213 combines respective outputs from the filtering arrangement 212. Typically, the combiner 213 combines each of the N outputs from a filter bank relating to a signal component to be transmitted with the corresponding outputs from the other filter banks relating to the other signal components to be transmitted, such that N combined (composite) signals are produced.

The pre-distorter 214 individually processes the N combined signals based on content of the database 216, and the sequencer 215 completes the up-sampling by sequencing the N outputs from the pre-distorter 214.

The up-sampled signal is converted to the analog domain in the DAC 221 and amplified in the amplifier 223 to produce a signal 203 suitable for transmission.

Optionally, the analog signal may be converted in frequency in the up-converter 222 before being input to the amplifier 223. For example, the up-converter 222 may be adapted such that the combined effect of the frequency positioning in 211, the filtering in 212, the sequencing in 215 and the up-conversion in 222 places the resulting signal components of the transmitted signal at the respective appropriate transmission frequencies. For example, if the up-sampled signal output from the sequencer is already located at the appropriate frequency, the real part of it may be fed to the DAC to generate the analog RF signal directly and the up-converter 222 is obsolete. If the up-sampled signal output from the sequencer is not located at the appropriate frequency, a mixer may be used to up-convert the signal to RF (for example an FQ modulator where the in-phase and quadrature components are output from an in-phase ADC and a quadrature ADC respectively, both fed by the complex output signal from the sequencer.

One advantage of the suggested structure is that the frequency domain parts of the distortion that are products of the intermodulation between frequency bands can be handled by incorporating the pre-distortion as an integrated part of a poly-phase structure. Some embodiments enable pre-distortion of very high bandwidth signals (e.g. multi frequency band signals) including inter-band intermodulation products while using a relatively low sampling speed and no additional processing chains for the intermodulation products. The commutation at the end of the proposed structures unfolds the signal and places all components in their appropriate position to form the wideband signal that is necessary to pre-distort the amplifier.

Figure 2B:
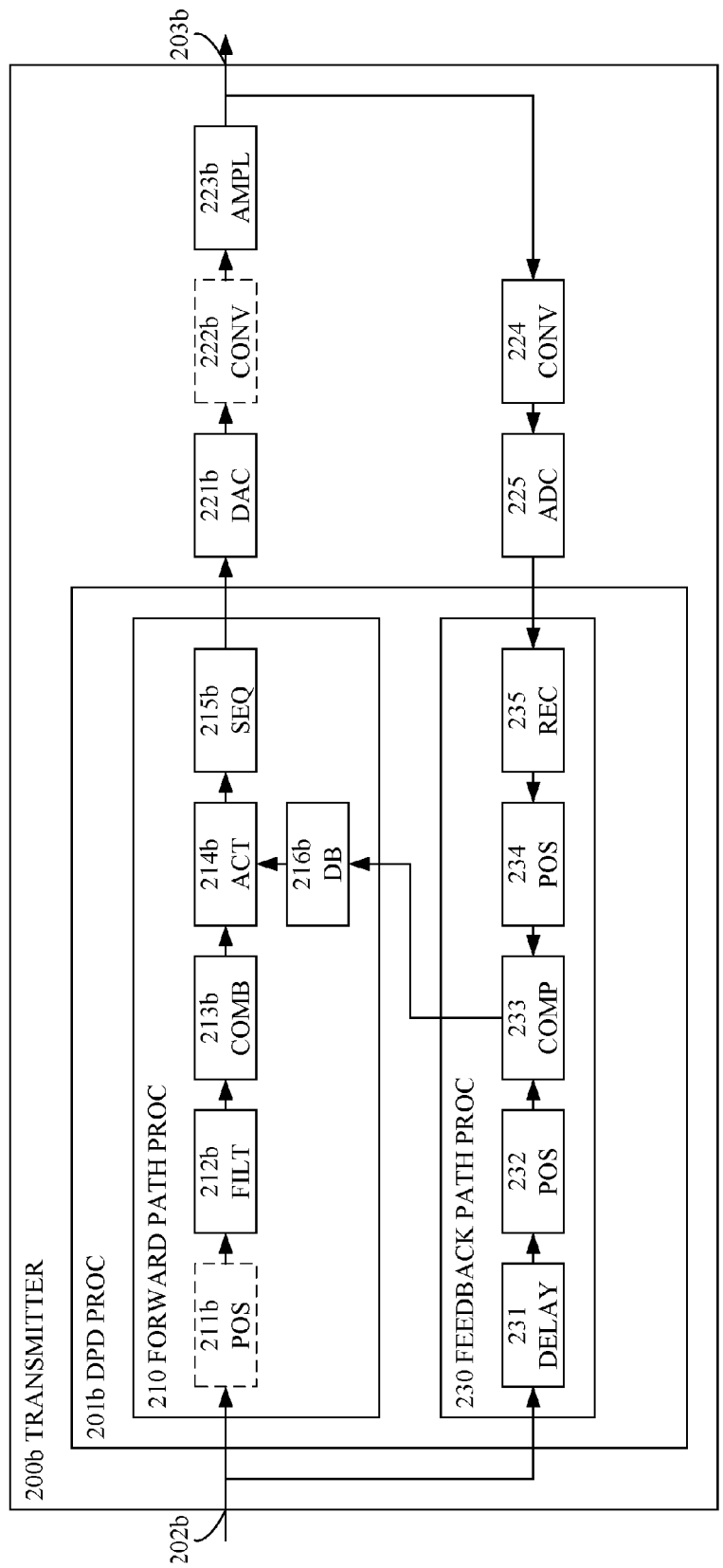
FIG. 2B is a block diagram illustrating an example pre-distortion arrangement with a feedback path according to some embodiments.

FIG. 2B illustrates an example pre-distortion processing arrangement (DPD PROC) 201$b$ that may be comprised in a transmitter 200$b$. The pre-distortion processing arrangement 201$b$ comprises a forward path processing arrangement (FORWARD PATH PROC) 210 and a feedback path processing arrangement (FEEDBACK PATH PROC) 230.

The forward path processing arrangement 210 comprises a filter arrangement (FILT) 212$b$, a combiner (COMB) 213$b$, a pre-distorter such as an actuator (ACT) 214$b$, a database (DB) 216$b$, a sequencer (SEQ) 215$b$, and optionally a frequency positioner (POS) 211$b$. The transmitter 200$b$ comprises the pre-distortion processing arrangement 201$b$, a digital-to-analog converter (DAC) 221$b$, an amplifier (AMPL) 223$b$, and optionally an up-converter (CONV) 222$b$. These components function in a similar fashion as the corresponding components of FIG. 2A and will not be elaborated on further in connection to FIG. 2B. An input signal 202$b$ is input to the pre-distortion processing arrangement 201$b$ of the transmitter 200$b$ and the amplifier 223$b$ produces a signal 203$b$ suitable for transmission in a similar manner as described in connection with FIG. 2A.

The feedback path processing arrangement 230 comprises a delay unit (DELAY) 231, two frequency positioners (POS) 232 and 234, a comparing unit (COMP) 233, and a receiver unit (REC) 235. The transmitter further comprises an analog-to-digital converter (ADC) 225 and a down-converter (CONV) 224.

The input signal 202$b$ input to forward path processing arrangement 210 is also input to the feedback path processing arrangement 230 and delayed in the delay unit 231. The delay may, for example, be chosen such that the timing of the delayed input signal coincides with the timing of the feedback signal at the comparing unit 233.

Each of the two or more signal components of the delayed input signal 202$b$ is then positioned individually in frequency by the frequency positioner 232 (which typically has no correlation with the frequency positioner 221$b$). For example, the signal components may be positioned such that there is no overlap between the signal components, including the intermodulation products that are to be taken into account in the comparison, in the frequency domain. The signal components may be positioned in a low frequency range, e.g. a baseband frequency range.

The signal 203b at the output of the amplifier 223b is input to the feedback path processing arrangement 230 after down-conversion from a high frequency to a lower frequency (e.g. a baseband frequency or an intermediate frequency) and conversion to the digital domain in the down-converter 224 and the ADC 225. Typically, the down-converter 224 down-converts each signal component of the signal 203b individually (e.g. by mixing by the corresponding carrier frequency), and the processing in the ADC 225 is performed per signal component.

Each of the two or more signal components is then filtered out individually in the receiver unit 235 and positioned individually in frequency by the frequency positioner 234 (which typically has no correlation with the frequency positioner 221b). The receiver filters may, for example, filter out the desired signal of each signal component and some intermodulation products close to the carrier. The frequency position of each signal component by the positioner 234 corresponds to the frequency position of each signal component by the positioner 232.

The comparing unit 223 compares the delayed input signal with the feedback signal and adapts the database 216b accordingly. The frequency positioning of the signal components in 232 and 234 enables the comparing unit 223 (and also other components of the feedback path) to run at a processing rate that is much lower than the Nyquist rate corresponding to the entire transmission bandwidth of the signal 203b. Typically, a processing rate corresponding to an accumulated bandwidth of the signal components after positioning in 232 is sufficient. If the adaption parameters are identical for all of the poly-phase branches (e.g. shared look-up tables), the computational costs in the comparing unit may be further reduced.

Different variations exist of the implementation and mutual placement of the down-converter 224, the ADC 225 and the receiver unit 235 and all such variations that result in an appropriately filtered digital baseband signal for each of the initial signal components are suitable for use in connection with the embodiments described herein. For example, a fast ADC 225 can be used to directly sample the RF signal in order to achieve a wide bandwidth. This technology is called direct RF and renders the down-converter 224 obsolete. In this example, the receiver unit may jointly down-sample and filter out each of the signal components from the output from the ADC 225. Further, the feedback receivers may, for example, be implemented by homodyne down-converting, heterodyne down-converting, or direct sampling of the RF signal.

Figure 2C:
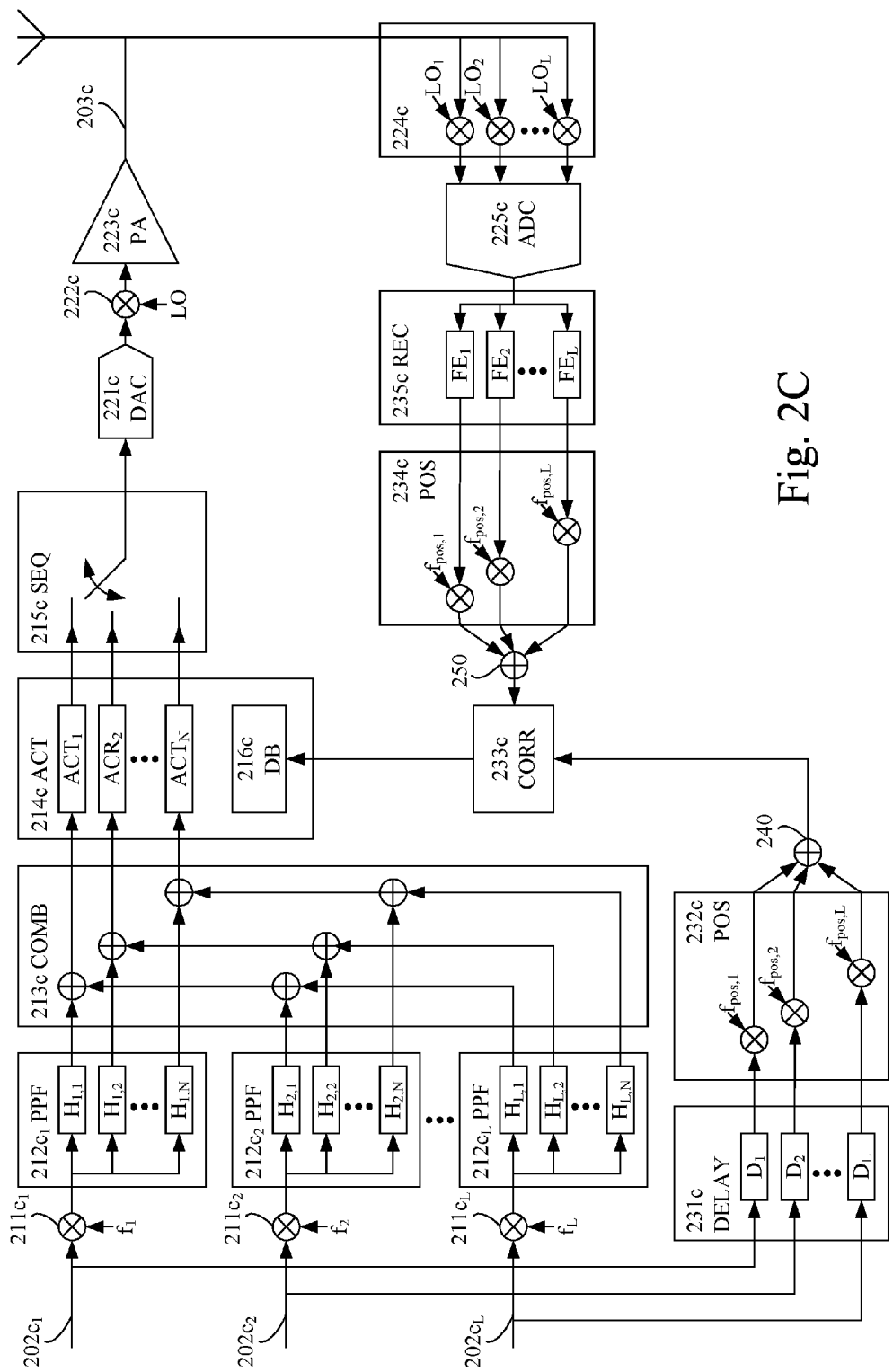
FIG. 2C is a block diagram illustrating an example pre-distortion arrangement with a feedback path according to some embodiments.

FIG. 2C illustrates a more detailed example transmitter with a pre-distortion processing arrangement.

The pre-distortion processing arrangement of FIG. 2C comprises a frequency positioner (e.g. a mixer) $211c_1$, $211c_2$, ..., $211c_L$ and a poly-phase filter (PPF) $212c_1$, $212c_2$, ..., $212c_L$ for each of L signal components $202c_1$, $202c_2$, ..., $202c_L$ in the input signal. The pre-distortion processing arrangement also comprises a combiner (COMB) 213c, an actuator (ACT) 214c, a database (DB) 216c, and a sequencer (SEQ) 215c.

The transmitter comprises the pre-distortion processing arrangement, a digital-to-analog converter (DAC) 221c, an amplifier (AMPL) 223c, and optionally an up-converter (CONV) 222c.

The L signal components $202c_1$, $202c_2$, ..., $202c_L$ of the input signal (to be transmitted e.g. in widely separated frequency bands) are positioned in respective frequency positions by mixing with a respective frequency $f_1, f_2, ..., f_L$ in the frequency positioners $211c_1$, $211c_2$, ..., $211c_L$, as explained before in connection to FIG. 2A. It should be noted that the frequency positioning may be optional in some applications, e.g. if the combined effect of other processing steps already places the resulting signal at the correct transmission frequency. Thus, the frequency positioners $211c_1$, $211c_2$, ..., $211c_L$ may be used to fine tune the frequency position when there is an offset between the transmission frequency and a closest multiple of $F_s/N$, where $F_s$ represents the sampling rate of the DAC.

Each of the L signal components is then filtered in a respective poly-phase filter $212c_1$, $212c_2$, ..., $212c_L$. Poly-phase filter structures are well known in the art. A poly-phase filter may be described as a filter bank comprising N interrelated filters ($H_{1,1}, H_{1,2}, ..., H_{1,N}$ for PPF $212c_1$; $H_{2,1}, H_{2,N}$ for PPF $212c_2$; and $H_{L,1}, H_{L,2}, ..., H_{L,N}$ for PPF $212c_L$) where each of the N interrelated filters comprises one or more taps of an overall filter function that defines the poly-phase filter. For example, if the overall filter function is defined at sampling rate N times R with M filter taps, then the first interrelated filter (e.g. $H_{1,1}, H_{2,1}, ..., H_{L,1}$) may be defined at sampling rate R and comprise taps 1, N+1, 2N+2, etc of the overall filter function, the second interrelated filter (e.g. $H_{1,2}, H_{2,2}, ..., H_{L,2}$) may be defined at sampling rate R and comprise taps 2, N+2, 2N+2, etc of the overall filter function, and so on until the $N^{th}$ interrelated filter (e.g. $H_{1,N}, H_{2,N}, ..., H_{L,N}$), which may be defined at sampling rate R and comprise taps N, 2N, 3N, etc of the overall filter function.

The combiner 213c combines respective outputs from the poly-phase filters $212c_1$, $212c_2$, ..., $212c_L$, such that N combined signals are produced. The combining may be performed by summation of $H_{1,1}, H_{2,1}, ..., H_{L,1}$, by summation of $H_{1,2}, H_{2,2}, ..., H_{L,2}$, etc as illustrated in FIG. 2C.

Then, the actuator 214c individually processes the N combined signals in respective processing blocks $ACT_1$, $ACT_2$, ..., $ACT_N$ based on content of the database 216c. As mentioned before, various pre-distortion algorithms are known in the art and the actuator 214c may apply any suitable known or future pre-distortion method.

The sequencer selects samples from the poly-phase paths in sequence to produce an up-sampled signal having a sample rate that is N times the sampling rate of the actuator outputs. Thus, if the first input to the sequencer (with sample rate R) is denoted $s_1(1), s_1(2), s_1(3), ...$, the second input to the sequencer (with sample rate R) is denoted $s_2(1), s_2(2), s_2(3), ...$, and the $N^{th}$ input to the sequencer (with sample rate R) is denoted $s_N(1), s_N(2), s_N(3), ...$, then the output from the sequencer (with sample rate RN is denoted $s_1(1), s_2(1), ..., s_N(1), s_1(2), s_2(2), ..., s_N(2), s_1(3), s_2(3), ..., s_N(3), ...$. The up-sampled signal is converted to the analog domain in the DAC 221c and amplified in the amplifier 223c to produce a signal 203c suitable for transmission.

Optionally, the analog signal may be converted in frequency in the up-converter 222c (e.g. by mixing with a local oscillator signal (LO) of suitable frequency) before being input to the amplifier 223c For example, the up-converter 222c may be adapted such that the combined effect of the frequency positioning in $211c_1$, $211c_2$, ..., $211c_L$, the filtering in $212c_1$, $212c_2$, ..., $212c_L$, the sequencing in 215c and the optional up-conversion in 222c places the resulting signal components at the respective appropriate transmission frequencies.

One benefit with the forward path processing structure presented in FIGS. 2A, 2B and 2C is that the processing blocks preceding the sequencer may operate at a relatively low processing rate R (e.g. corresponding to the sample rate of the input signal(s)), while still being able to handle linearization (e.g. of intermodulation products) of an overall bandwidth of the transmitted signal (corresponding to a sample rate of R times N).

The pre-distortion processing arrangement of FIG. 2C further comprises a delay unit (DELAY) 231c, two frequency positioners (POS) 232c and 234c, two combiners 240 and 250, a correction unit (CORR) 233c, and a receiver unit (REC) 235c. The transmitter further comprises an analog-to-digital converter (ADC) 225c and a down-converter (CONV) 224c.

The L signal components $202c_1, 202c_2, \ldots, 202c_L$ of the input signal are input to the delay unit 231c and delayed in respective delay elements $(D_1, D_2, \ldots, D_L)$. As mentioned in connection with FIG. 2B, the respective delays may, for example, be chosen such that the timing of the delayed input signal coincides with the timing of the feedback signal at the correction unit 233c. Typically, but not necessarily, the respective delay elements $(D_1, D_2, \ldots, D_L)$ have equal delay times.

Each of the delayed L signal components is then positioned individually in frequency by the frequency positioner 232c, e.g. by mixing with a respective positioning frequency $f_{pos,1}$, $f_{pos,2}, \ldots, f_{pos,L}$, and the L frequency positioned signal components are combined into a single signal (a composite reference signal) by the combiner 240 (e.g. an adder). For example, the signal components may be positioned such that there is no overlap in the combined signal between the signal components, including the intermodulation products that are to be taken into account in the comparison, in the frequency domain.

The signal 203c at the output of the amplifier 223c is down-converted from a high frequency to a lower frequency (e.g. a baseband frequency or an intermediate frequency) in the down-converter 224c and converted to the digital domain in the ADC 225c. Typically, the down-converter 224c down-converts each signal component of the signal 203c individually (e.g. by mixing with a respective local oscillator signal $(LO_1, LO_2, \ldots, LO_L)$ of suitable frequency which may be the corresponding carrier frequency), and the processing in the ADC 225c is performed per signal component.

Each of the L signal components is then filtered out individually in the receiver unit 235c using respective receive filters $FE_1, FE_2, \ldots, FE_L$ and positioned individually in frequency by the frequency positioner 234c, e.g. by mixing with a respective positioning frequency $f_{pos,1}, f_{pos,2}, \ldots, f_{pos,L}$. The frequency position of each signal component by the positioner 234c corresponds to the frequency position of each signal component by the positioner 232c. The L frequency positioned signal components are combined into a single signal (a composite feedback signal) by the combiner 250 (e.g. an adder).

The correction unit 223c compares the composite feedback signal and the composite reference signal and adapts the database 216c accordingly. To this end, the correction unit may comprise a comparator, a determiner configured to determine correction parameters based on the comparison and a pre-distorter controller configured to adapt the database 216c based on the correction parameters.

One benefit with the feedback path processing structure presented in FIGS. 2B and 2C is that the processing blocks in the digital domain may operate at a relatively low processing rate that is much lower than the Nyquist rate corresponding to the entire transmission bandwidth of the signal 203c. Typically, a processing rate corresponding to a total bandwidth of the signal components after positioning in 232c is sufficient.

Figure 3A:
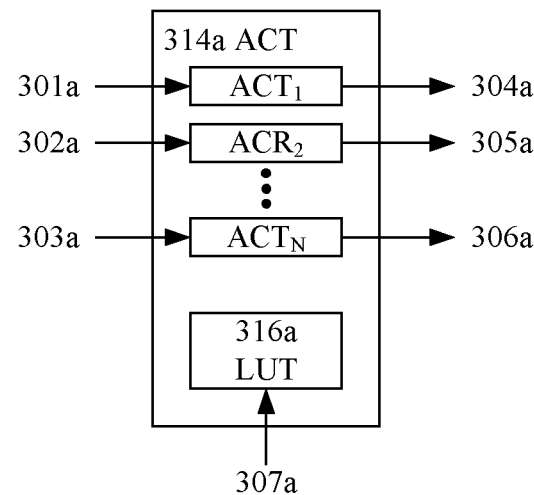
FIG. 3A is a block diagram illustrating an example actuator implementation according to some embodiments.
Figure 3B:
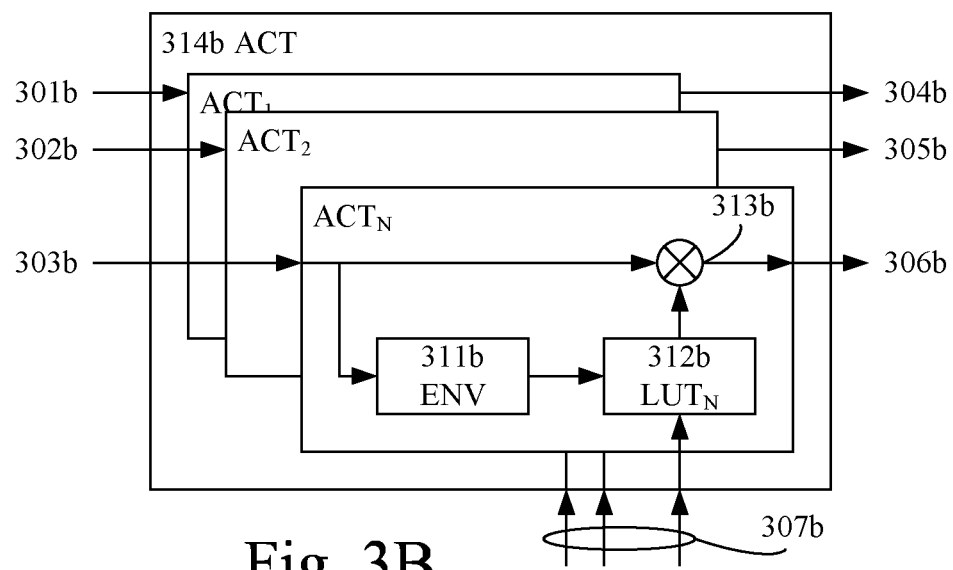
FIG. 3B is a block diagram illustrating an example actuator implementation according to some embodiments.
Figure 3C:
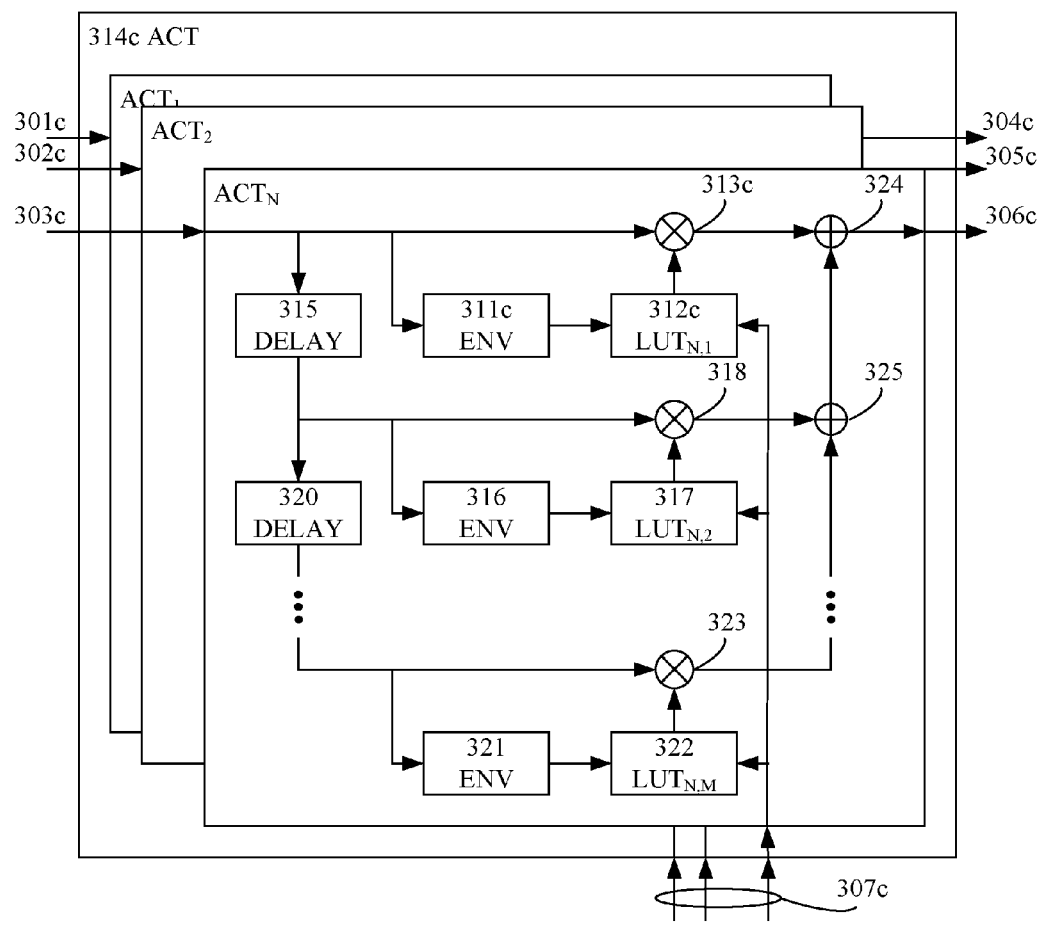
FIG. 3C is a block diagram illustrating an example actuator implementation according to some embodiments.

As mentioned before, any suitable known of future pre-distortion algorithm may be applied in the actuator 214, 214b, 214c (and in the individual processing blocks $ACT_1$, $ACT_2, \ldots, ACT_N$ of 214c). FIGS. 3A, 3B and 3C illustrate a few example actuator implementations.

In FIG. 3A, an actuator (ACT) 314a comprises N individual actuator processing blocks $ACT_1, ACT_2, \ldots, ACT_N$ that chare a common look-up table (LUT) 316a defining the applicable pre-distortion function. Each of the processing blocks may, for example, be similar to the PDP actuator 110 of FIG. 1 while sharing a single LUT. Similarly to the actuator 214c of FIG. 2C, each actuator processing block produces a respective pre-distorted signal 304a, 305a, 306a based on a respective input signal 301a, 302a, 303a, and the look-up table 316a may be adapted based on adaptation parameters 307a (e.g. from feedback path processing).

In FIG. 3B, an actuator (ACT) 314b also comprises N individual actuator processing blocks $ACT_1, ACT_2, \ldots, ACT_N$. However, in this implementation each actuator processing block has its own look-up table defining the applicable pre-distortion function. Each of the processing blocks may, for example, be similar to the PDP actuator 110 of FIG. 1. Thus, the processing block $ACT_N$ comprises an envelope extractor (ENV) 311b, a look-up table ($LUT_N$) 312b and a signal combiner (e.g. a mixer) 313b. The envelope extractor 311b determines the envelope of the signal 303b and uses the determined envelop value for addressing the look-up table 312b. Based on the determined envelope, the look-up table outputs a compensation signal which is combined with the signal 303b by the signal combiner 313b to produce the pre-distorted signal 306b. Each actuator processing block produces a respective pre-distorted signal 304b, 305b, 306b based on a respective input signal 301b, 302b, 303b, and the look-up tables 312b may be individually adapted based on adaptation parameters 307b (e.g. from feedback path processing).

Many variations of the example implementation of FIG. 3B may be applicable in various embodiments. For example, the envelope extractor may output a function of the envelope, quantized envelope values, an absolute value of the signal 303b, etc. As a further example, the output of the look-up table may be processed or input to a signal generator to produce the compensation signal.

In FIG. 3C, an actuator (ACT) 314c also comprises N individual actuator processing blocks $ACT_1, ACT_2, \ldots, ACT_N$. This implementation is adapted to encompass a memory effect of the non-linearity to be linearized (e.g. in a power amplifier). This implementation applies several look-up tables for each actuator processing block (or several look-up tables shared by the actuator processing blocks) and addition of time-delayed pre-distorted signals. Placement of such identical instances of multi-LUT actuator processing blocks in the arrangement of e.g. FIG. 2A, 2B or 2C enables handling of memory effects in, for example, the power amplifier.

Each of the processing blocks (e.g. the processing block $ACT_N$) comprises a non-delayed processing path with an envelope extractor (ENV) 311c, a look-up table ($LUT_{N,1}$) 312c and a signal combiner (e.g. a mixer) 313c. The operation of the non-delayed processing path is similar to that described in connection to FIG. 3B.

Each of the processing blocks further comprises one or more delayed processing paths preceded by a respective delay element (DELAY) 314, 320. Each of the delayed processing paths also comprises an envelope extractor (ENV) 316, 321, a look-up table ($LUT_{N,2}$, $LUT_{N,M}$) 317, 322 and a signal combiner (e.g. a mixer) 318, 323, and the operation of each of the delayed processing paths is similar to that described in connection to FIG. 3B. The delay elements 314, 320 are adapted to cover the length of the memory effect to be encompassed.

The results of the M processing paths are combined (e.g. by adding) in one or more combiners 324, 325 to produce a pre-distorted signal 306c.

As in FIG. 3B, each actuator processing block produces a respective pre-distorted signal 304c, 305c, 306c based on a respective input signal 301c, 302c, 303c, and the look-up tables 312b, 317, 322 may be individually adapted based on adaptation parameters 307c (e.g. from feedback path processing).

A pre-distorter that encompasses memory effects may also be found in "A memory polynomial predistorter implemented using TMS320C67xx" by L. Ding, H. Qian, N. Chen and G. T. Zhou, Proc. Texas Instruments Developer Conference, Houston, Tex., February 2004.

In some of the following examples, it will be assumed that each of the two or more (L) initial signals represent a signal that is to be transmitted in a unique frequency band.

Figure 4A:
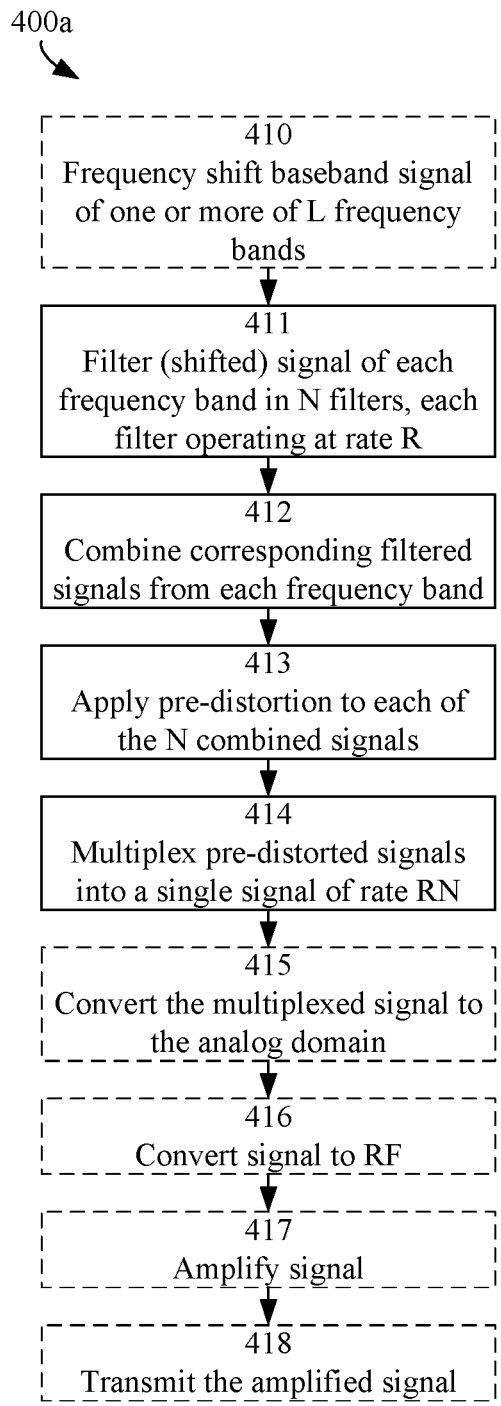
FIG. 4A is a flowchart illustrating example method steps according to some embodiments.

FIG. 4A illustrate an example method 400a that may be performed, for example, by any of the arrangements illustrated in FIGS. 2A, 2B and 2C.

The method starts in step 410a, where the initial signal of one or more of L frequency bands is shifted in frequency (e.g. by mixing with a respective positioning frequency). This operation may, for example be performed by 211, 211b, $211c_1$, $211c_2$, $211c_L$ of FIGS. 2A, 2B and 2C respectively.

In step 411, the (possibly shifted) initial signal of each frequency band is filtered at rate R in N interrelated filters of a respective filter bank. This operation may, for example be performed by 212, 212b, $212c_1$, $212c_2$, $212c_L$ of FIGS. 2A, 2B and 2C respectively.

Corresponding filtered signals of the respective filter banks (i.e. of the respective frequency bands) are combined in step 412. The combination may comprise addition, and each of the N combined (composite) signals have sampling rate R. This operation may, for example be performed by 213, 213b, 213c of FIGS. 2A, 2B and 2C respectively.

Suitable digital pre-distortion is applied to each of the N composite signals at processing rate R in step 413, and in step 414, the N pre-distorted composite signals are multiplexed into a single pre-distorted digital signal having sample rate N times R. These operations may, for example be performed by 214, 215, 214b, 215b, 214c, 215c of FIGS. 2A, 2B and 2C respectively.

Optionally, the multiplexed pre-distorted digital signal may be converted to the analog domain in step 415, up-converted to an appropriate radio frequency in step 416, amplified in step 417 and transmitted in step 418. These operations may, for example be performed by 221, 222, 223, 221b, 222b, 223b, 221c, 222c, 223c of FIGS. 2A, 2B and 2C respectively.

Figure 4B:
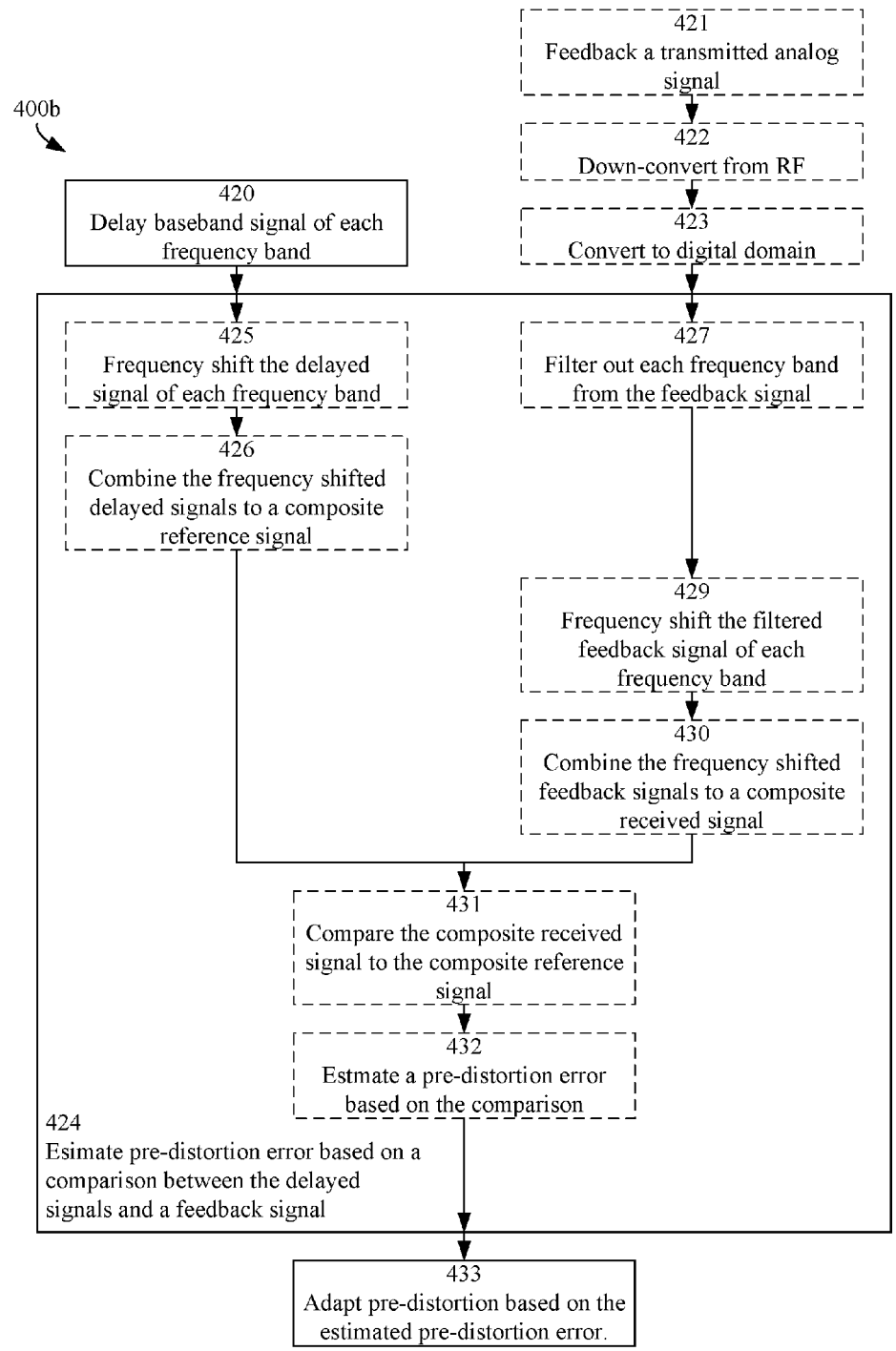
FIG. 4B is a flowchart illustrating example method steps according to some embodiments.

FIG. 4B illustrate an example method 400b that may be performed, for example, by any of the arrangements illustrated in FIGS. 2B and 2C.

The method comprises delaying the initial signals of each of the frequency bands in step 420. This operation may, for example be performed by 231, 231c of FIGS. 2B and 2C respectively.

In step 424, a pre-distortion error is estimated based on a comparison between the delayed initial signals and a feedback signal, and in step 433, a digital pre-distortion is adapted based on the pre-distortion error estimation. Adapting the digital pre-distortion based on the pre-distortion error estimation may comprise determining correction parameters based on the pre-distortion error estimation and adapting the digital pre-distortion based on the correction parameters. The operation of step 433 may, for example be performed by 233, 233c of FIGS. 2B and 2C respectively.

In parallel to step 420 (preceding step 424), the method may comprise feeding back a transmitted analog signal in step 421, down-converting the feedback signal in step 422 and converting the feedback signal to the digital domain in step 423. These operations may, for example be performed by 224, 225, 224c, 225c of FIGS. 2B and 2C respectively.

Step 424 may comprise sub-steps 425, 426, 427, 429, 430, 431 and 432. Each of the delayed initial signals is mixed with a respective feedback positioning frequency in sub-step 425, and the frequency shifted delayed initial signals are combined in sub-step 426 to produce a composite reference signal. These operations may, for example be performed by 232, 232c, 240 of FIGS. 2B and 2C respectively.

For each of the frequency bands, a receive filter is applied in sub-step 427 to produce filtered feedback signals of each of the frequency bands. Each filtered feedback signal is mixed with the respective feedback positioning frequency in sub-step 429 to produce a frequency shifted feedback signal. Frequency shifted feedback signals are combined in sub-step 430 to produce a composite feedback signal. These operations may, for example be performed by 235, 234, 234c, 234c, 250 of FIGS. 2B and 2C respectively.

The composite reference signal is compared with the composite feedback signal in sub-step 431 to produce the pre-distortion error estimation in sub-step 432. These operations may, for example be performed by 233, 233c of FIGS. 2B and 2C respectively.

Figure 4C:
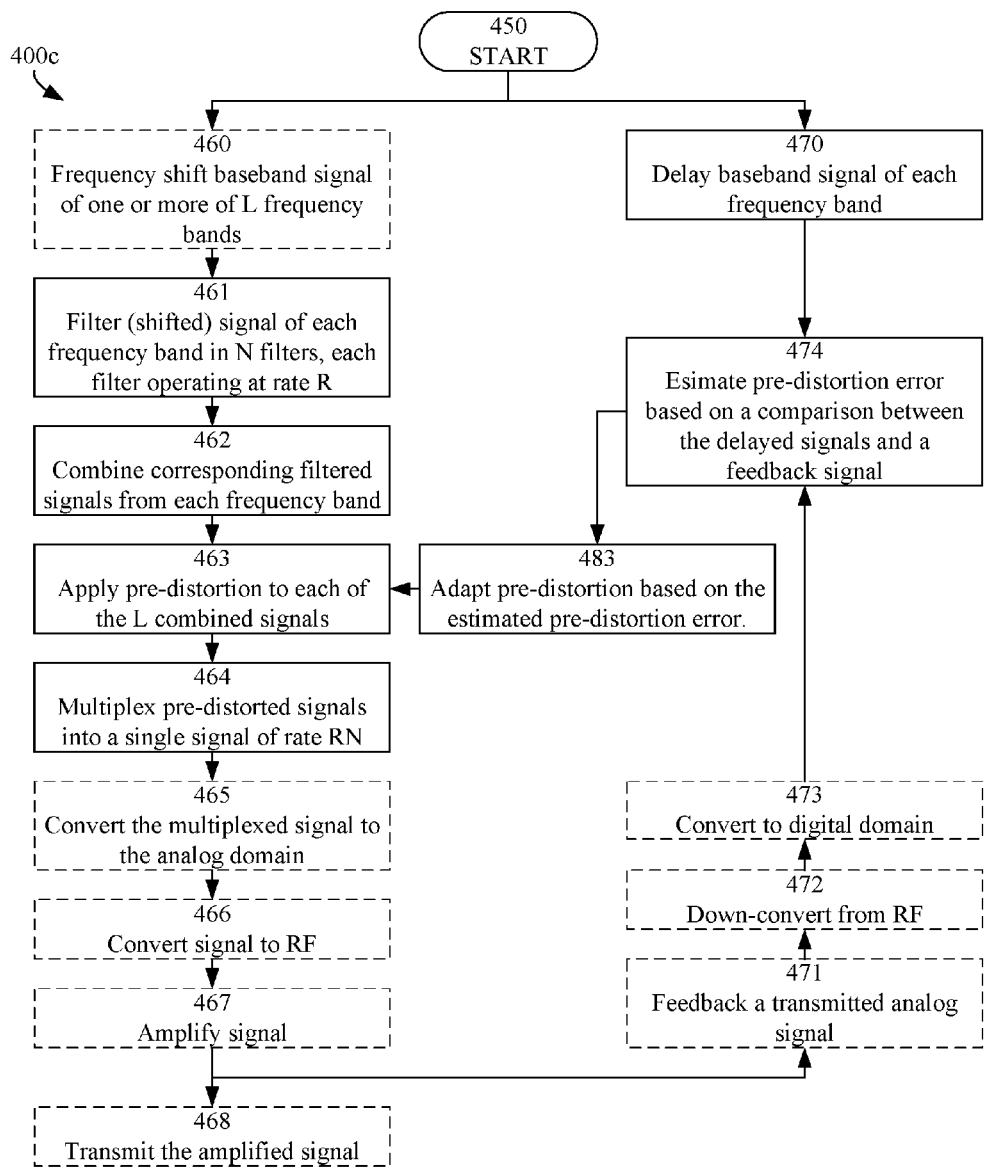
FIG. 4C is a flowchart illustrating example method steps according to some embodiments.

FIG. 4C illustrate an example method 400c that may be performed, for example, by any of the arrangements illustrated in FIGS. 2B and 2C. The method 400c is a combination of the methods 400 and 400b of FIGS. 4A and 4B respectively.

The method starts in step 450, and proceeds in parallel to steps 410 and 470. Steps 460, 461, 462, 463, 464, 465, 466, 467 and 468 correspond respectively to steps 410, 411, 412, 413, 414, 415, 416, 417 and 418 of FIG. 4A and will not be elaborated on further. Similarly, steps 470, 471, 472, 473, 474 and 483 correspond respectively to steps 420, 421, 422, 423, 424 and 433 of FIG. 4B and will not be elaborated on further. Steps 460 and 470 operate on the same initial signals of each of the frequency bands, the amplified signal of step 467 is used as the feedback signal of step 471 and the adaptation of step 483 affects the pre-distortion of step 463.

As already mentioned, poly-phase decomposition of a filter is a known method in the art of digital processing. The approach is used herein to reduce the required processing speed by decomposing required signal processing parts (e.g. an overall filter structure and pre-distortion processing) in N parallel paths. In the poly-phase filter structure, each path is using a subset of the full collection of filter tap coefficients for the overall filter structure and the signal processing of each path may be performed at a rate that is 1/N of the total required sampling rate to cover the entire bandwidth for transmission. Thus, the poly-phase filter structure in combination with a commutator (sequencer, multiplexer) collecting the outputs to the total required sampling rate can be used as an up-sampler and frequency band selector.

Figure 5:
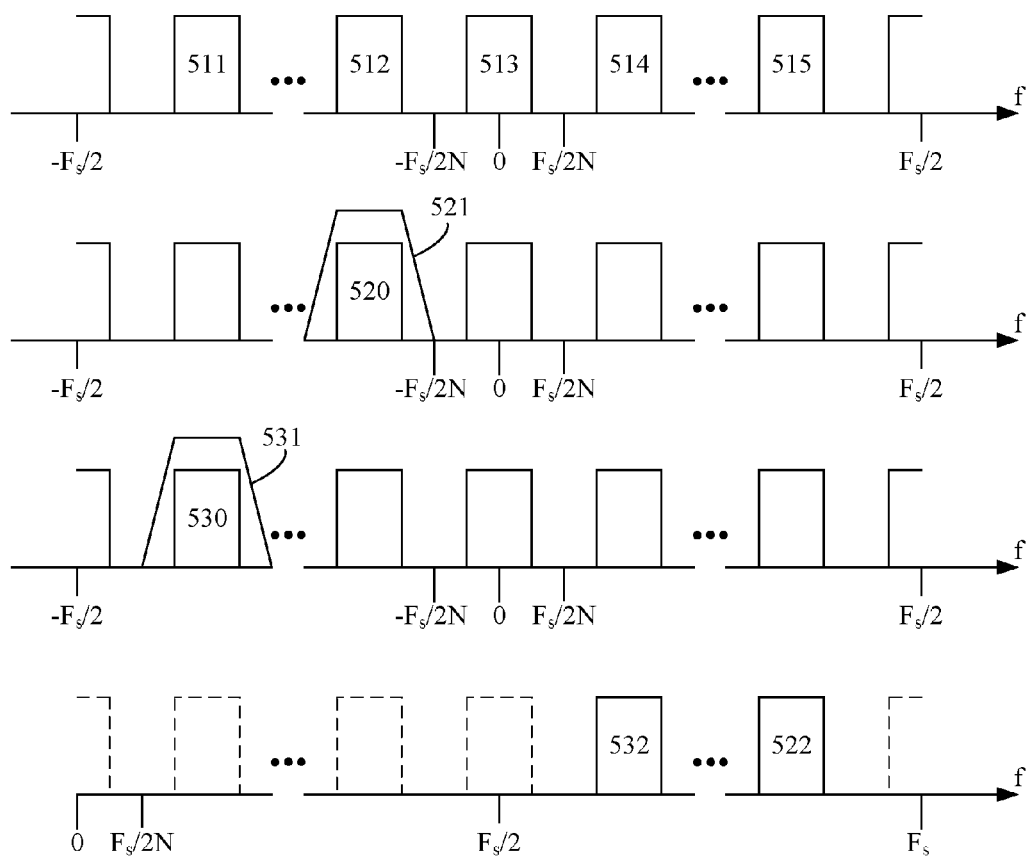
FIG. 5 is a schematic plot illustrating example effects in the frequency domain of a pre-distortion arrangement.

FIG. 5 illustrates example effects in the frequency domain of a pre-distortion arrangement such as, for example the one described in connection to FIG. 2A, 2B or 2C. FIG. 5 presents first, second, third and fourth (from upper to lower) frequency domain illustrations. Hence the x-axes represent frequency and the y-axes represent a power content of the spectrum. $F_s$=RN represents the sampling rate of the DAC.

If the signal spectrum 513 represent the baseband spectrum of one of the input signal components (compare with $202c_1$, $202c_2$, $202c_L$ of FIG. 2C), the first frequency domain illustration shows the output from the sequencer if an identity filter is applied in each of the poly-phase paths and only the one input signal component was present. There would be a series of N replicas (511, 512, 513, 514, 515) of the input spectrum, distributed at $F_s/N$ intervals in frequency.

By adding a poly-phase filter structure, one of these replica spectra can be selected if the filter bandwidth is restricted to $F_s/N$. Thus, a joint up-sampling and frequency selection is achieved by the poly-phase filter combined with the sequencer. For example, in the second frequency domain illustration the replica spectrum 520 of a first frequency band is selected by the poly-phase filter function 521, and in the third frequency domain illustration the replica spectrum 530 of a second frequency band is selected by the poly-phase filter function 531.

When a combiner (compare with 213, 213*b*, 213*c* of FIG. 2A, 2B or 2C) is applied between the poly-phase filters and the sequencer (e.g. adding corresponding poly-phase signals for the frequency bands to form N composite poly-phase signals), the signal spectrum shown in the fourth frequency domain illustration is achieved. Here the selected spectrum components 532 and 522 (compare with 530 and 520 respectively) appear at their appropriate frequency position in the composite up-sampled signal. It may be noted that this illustration shows the complex spectrum on a scale from 0 to $F_s$ while only the real component of the spectrum is transmitted (the imaginary component is typically discarded before conversion to the digital domain, e.g. before or after the sequencer).

The DPD actuator structure of FIG. 3C enables compensation for memory effects in the components to be linearized. This is achieved by the specific structure proposed since the memory effects need only be compensated in a time scale $N/F_s$ (in the notation of FIG. 5) and cross correlation terms between the different poly-phase paths need not be generated and accounted for.

Furthermore, the up-conversion resulting in an expanded bandwidth at the output after the sequencer enables the pre-distorter to add pre-distortion components in a bandwidth of $F_s/2$ (e.g. the interval $[F_s/2; F_s]$ as in FIG. 5), despite that the bandwidth in each poly-phase path is restricted to $F_s/N$. This means that inter-band intermodulation compensation can be applied by the pre-distorter.

Figure 6:
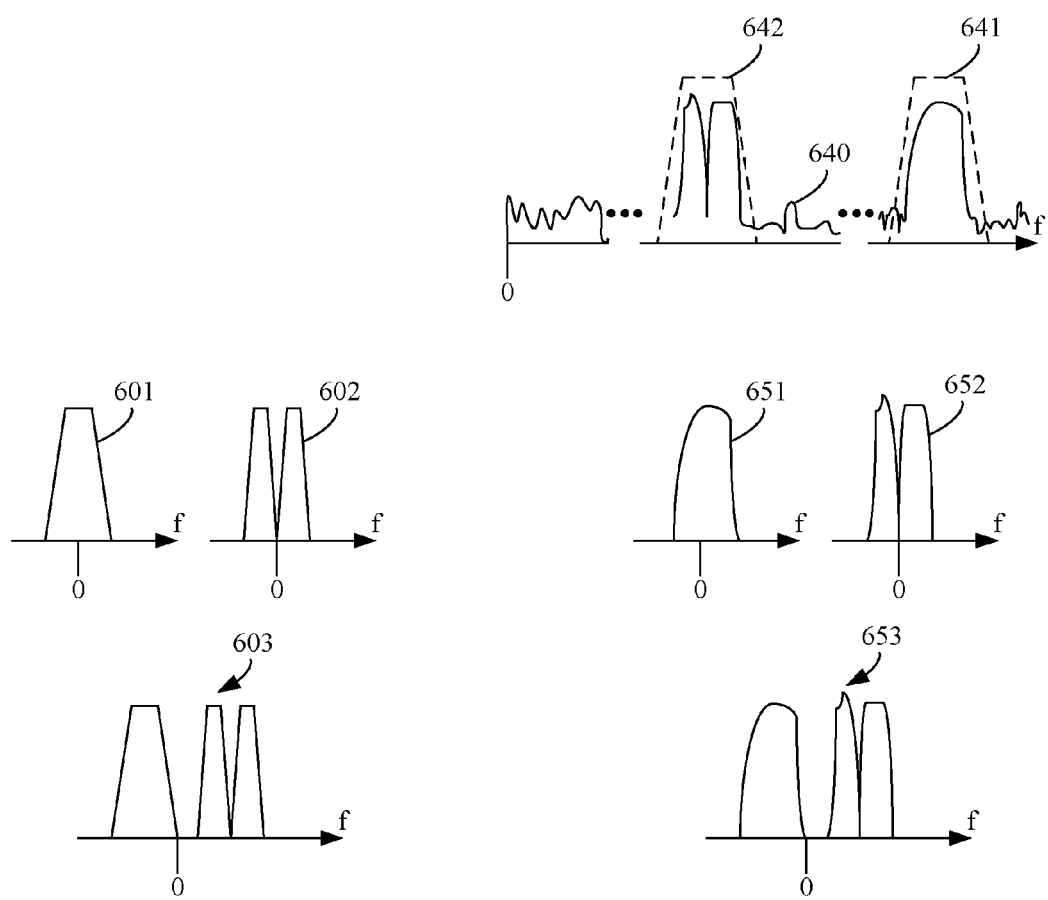
FIG. 6 is a schematic plot illustrating example effects in the frequency domain of a pre-distortion adaptation arrangement.

FIG. 6 illustrates example effects in the frequency domain of a pre-distortion adaptation arrangement such as, for example the feedback paths described in connection to FIG. 2B or 2C.

The adaptation arrangement performs an adaptation of correction parameters fed to the actuator. This enables the pre-distortion to follow variations e.g. in the amplifier non-linear characteristics.

One problem when implementing a feedback path for very wide bandwidth signals is how to handle the high processing speed that is required to cover the frequency bands and any intermodulation products in the feedback processing. Embodiments are particularly applicable when the feedback signal only needs to encompass some of the intermodulation products (e.g. up to third order) around the carriers and none of the inter-band intermodulation products. Then the processing bandwidth needed in the adaptation arrangement equals the combined filtered bandwidth of the feedback receiver paths for the used frequency bands. This limited processing bandwidth can be realized by placing the carriers of the used frequency bands in a reference frequency configuration when the transmitted signal is compared to a delayed copy of the input signal, as has been exemplified in FIGS. 2B and 2C.

FIG. 6 presents first, second, third, fourth and fifth (upper left, lower left, upper right, middle right, lower right) frequency domain illustrations. Hence the x-axes represent frequency and the y-axes represent a power content of the spectrum.

The first frequency domain illustration represent two baseband signal components 601, 602 of the initial signals (compare with $202c_1$, $202c_2$, $202c_L$ of FIG. 2C), and the second frequency domain illustration shows the composite reference signal in a reference signal configuration after frequency positioning and combination (compare with 232*c*, 240 of FIG. 2C).

The third frequency domain illustration represents the full bandwidth transmitted signal 640 comprising signal components 641, 642 (compare with 203*c* of FIG. 2C) and intermodulation products. The fourth frequency domain illustration represent the two signal components 651, 652 after down-conversion to baseband and receive filtering in the feedback path (compare with 224*c*, 225*c*, 235*c* of FIG. 2C), and the fifth frequency domain illustration shows the composite feedback signal in the reference signal configuration after frequency positioning and combination (compare with 234*c*, 250 of FIG. 2C).

Thus, the spectrum of the second and fifth frequency domain illustration may be compared to generate correction parameters for the pre-distortion, while not requiring more than moderate processing rate in the adaptor. Typically, the processing rate in the feedback path may be set to the accumulated bandwidth of the signal component spectra including relevant intermodulation products.

The described embodiments and their equivalents may be realized in software or hardware or a combination thereof. They may be performed by general-purpose circuits associated with or integral to a communication device, such as digital signal processors (DSP), central processing units (CPU), co-processor units, field-programmable gate arrays (FPGA) or other programmable hardware, or by specialized circuits such as for example application-specific integrated circuits (ASIC). All such forms are contemplated to be within the scope of this disclosure.

Embodiments may appear within an electronic apparatus (such as a wireless communication device) comprising circuitry/logic or performing methods according to any of the embodiments. The electronic apparatus may, for example, be a portable or handheld mobile radio communication equipment, a mobile radio terminal, a mobile telephone, an electronic organizer, a smartphone, a computer, or a mobile gaming device.

Reference has been made herein to various embodiments. However, a person skilled in the art would recognize numerous variations to the described embodiments that would still fall within the scope of the claims. For example, the method embodiments described herein describes example methods through method steps being performed in a certain order. However, it is recognized that these sequences of events may take place in another order without departing from the scope of the claims. Furthermore, some method steps may be performed in parallel even though they have been described as being performed in sequence.

In the same manner, it should be noted that in the description of embodiments, the partition of functional blocks into particular units is by no means limiting. Contrarily, these partitions are merely examples. Functional blocks described herein as one unit may be split into two or more units. In the same manner, functional blocks that are described herein as being implemented as two or more units may be implemented as a single unit without departing from the scope of the claims.

Hence, it should be understood that the details of the described embodiments are merely for illustrative purpose and by no means limiting. Instead, all variations that fall within the range of the claims are intended to be embraced therein.

The invention claimed is:

1. A digital pre-distortion method comprising:
for each of two or more initial signals to be amplified simultaneously by a non-linear power amplifier, filtering the initial signal in each of N interrelated filters of a respective filter bank to produce N digital filtered signals, N being an integer greater than 1, wherein the initial signal and each of the digital filtered signals have a first sample rate R and multiplexed impulse responses of the interrelated filters of the respective filter bank define an overall filter function comprising a pass band associated with a transmission frequency of the initial signal;
combining corresponding digital filtered signals of each of the two or more initial signals to produce N composite digital signals having the first sample rate R;
applying digital pre-distortion at a processing rate R to each of the composite digital signals to produce N pre-distorted composite digital signals having the first sample rate R; and
multiplexing the N pre-distorted composite digital signals to produce a pre-distorted digital signal having a second sample rate N times R,
wherein:
the pre-distorted digital signal comprises a signal component of each of the two or more initial signals;
the processing rate R and the sample rate R, are equal; and
the second sample rate N times R is greater than or equal to a total bandwidth comprising the transmission frequencies of the two or more initial signals.

2. The method of claim 1 further comprising:
digital-to-analog converting the pre-distorted digital signal to a pre-distorted analog signal; and
amplifying the pre-distorted analog signal in the non-linear power amplifier to produce an amplified signal.

3. The method of claim 1 further comprising:
digital-to-analog converting the pre-distorted digital signal to a pre-distorted analog signal;
mixing the pre-distorted analog signal with a first radio frequency modulation signal to produce a radio frequency pre-distorted analog signal; and
amplifying the radio frequency pre-distorted analog signal in the non-linear power amplifier to produce an amplified signal.

4. The method of claim 2 further comprising transmitting the amplified signal over a transmission medium.

5. The method of claim 1 wherein each of the two or more initial signals is a baseband signal.

6. The method of claim 5 further comprising mixing each of the two or more initial signals with a respective positioning frequency before filtering the initial signal.

7. The method of claim 5 further comprising:
delaying each of the initial signals to produce delayed initial signals;
comparing the delayed initial signals with a digital feedback signal to produce a pre-distortion error estimation, wherein the digital feedback signal represents the pre-distorted digital signal influenced by the non-linear power amplifier; and
adapting the digital pre-distortion based on the pre-distortion error estimation.

8. The method of claim 7 wherein comparing the delayed initial signals with a digital feedback signal comprises:
mixing each of the delayed initial signals with a respective feedback positioning frequency to produce respective frequency shifted delayed initial signals;
combining the respective frequency shifted delayed initial signals to produce a composite reference signal;
for each transmission frequency of the two or more initial signals, filtering the digital feedback signal with a respective receiver filter to produce a filtered feedback signal and mixing the filtered feedback signal with the respective feedback positioning frequency to produce a frequency shifted baseband feedback signal;
combining the frequency shifted baseband feedback signals to produce a composite feedback signal; and
comparing the composite reference signal with the composite feedback signal to produce the pre-distortion error estimation.

9. The method of claim 8, wherein adapting the digital pre-distortion based on the pre-distortion error estimation comprises:
determining correction parameters based on the pre-distortion error estimation; and
adapting the digital pre-distortion based on the correction parameters.

10. A digital pre-distortion arrangement comprising:
a respective filter bank for each of two or more initial signals to be amplified simultaneously by a non-linear power amplifier, wherein each respective filter bank comprises N interrelated filters and is configured to filter the initial signal in each of the interrelated filters to produce N digital filtered signals, N being an integer greater than 1, wherein the initial signal and each of the digital filtered signals have a first sample rate R and wherein multiplexed impulse responses of the interrelated filters of the respective filter bank define an overall filter function comprising a pass band associated with a transmission frequency of the initial signal;
N combiners, each configured to combine corresponding digital filtered signals of each of the two or more initial signals to produce a composite digital signal having the first sample rate R;
N pre-distorters, each configured to apply digital pre-distortion at a processing rate R to a respective one of the composite digital signals to produce a pre-distorted composite digital signal having the first sample rate R; and
a multiplexer configured to multiplex the N pre-distorted composite digital signals to produce a pre-distorted digital signal having a second sample rate N times R;
wherein:
the pre-distorted digital signal comprises a signal component of each of the two or more initial signals;
the processing rate R and the first sample rate R are equal; and
the second sample rate N times R is greater or equal to a total bandwidth comprising the transmission frequencies of the two or more initial signals.

11. The arrangement of claim 10 further comprising:
a digital-to-analog converter configured to convert the pre-distorted digital signal to a pre-distorted analog signal; and the non-linear power amplifier configured to amplify the pre-distorted analog signal in the non-linear power amplifier to produce an amplified signal.

12. The arrangement of claim 11 further comprising a mixer configured to mix the pre-distorted analog signal with a first radio frequency modulation signal before amplification.

13. The arrangement of claim 10 wherein each of the two or more initial signals is a baseband signal.

14. The arrangement of claim 13 further comprising, a mixer for each of the two or more initial signals, each mixer configured to mix the initial signal with a respective positioning frequency before filtering of the initial signal.

15. The arrangement of claim 13 further comprising:
one or more delay elements configured to delay each of the initial signals to produce delayed initial signals; and
an adaptor circuit configured to compare the delayed initial signals with a digital feedback signal to produce a pre-distortion error estimation, wherein the digital feedback signal represents the pre-distorted digital signal influenced by the non-linear power amplifier, and to adapt the digital pre-distortion based on the pre-distortion error estimation.

16. The arrangement of claim 15 wherein the adaptor circuit comprises:
a mixer for each of the two or more initial signals configured to mix the delayed initial signal with a respective feedback positioning frequency to produce a respective frequency shifted delayed initial signal;
a combiner configured to combine the respective frequency shifted delayed initial signals to produce a composite reference signal;
a respective receive filter for each of the two or more initial signals configured to filter the digital feedback signal to produce a respective filtered feedback signal;
a mixer for each of the two or more initial signals configured to mix the filtered feedback signal with the respective feedback positioning frequency to produce a frequency shifted baseband feedback signal;
a combiner configured to combine the frequency shifted baseband feedback signals to produce a composite feedback signal; and
a comparator configured to compare the composite reference signal with the composite feedback signal to produce the pre-distortion error estimation.

17. The arrangement of claim 16 wherein the adaptor circuit further comprises:
a determiner configured to determine correction parameters based on the pre-distortion error estimation; and
a pre-distorter controller configured to adapt operation of the N pre-distorters based on the correction parameters.

18. The arrangement of claim 15 further comprising an analog-to-digital converter configured to convert an analog feedback signal representing the pre-distorted digital signal influenced by the non-linear power amplifier to the digital feedback signal.

19. The arrangement of claim 11 further comprising a mixer configured to mix the analog feedback signal with a second radio frequency modulation signal before converting it to the digital feedback signal.

20. A transmitter comprising a digital pre-distortion arrangement, wherein the digital pre-distortion arrangement comprises:
a respective filter bank for each of two or more initial signals to be amplified simultaneously by a non-linear power amplifier, wherein each respective filter bank comprises N interrelated filters and is configured to filter the initial signal in each of the interrelated filters to produce N digital filtered signals, N being an integer greater than 1, wherein the initial signal and each of the digital filtered signals have a first sample rate R and wherein multiplexed impulse responses of the interrelated filters of the respective filter bank define an overall filter function comprising a pass band associated with a transmission frequency of the initial signal;
N combiners, each configured to combine corresponding digital filtered signals of each of the two or more initial signals to produce a composite digital signal having the first sample rate R;
N pre-distorters, each configured to apply digital pre-distortion at a processing rate R to a respective one of the composite digital signals to produce a pre-distorted composite digital signal having the first sample rate R; and
a multiplexer configured to multiplex the N pre-distorted composite digital signals to produce a pre-distorted digital signal having a second sample rate N times R;
wherein:
the pre-distorted digital signal comprises a signal component of each of the two or more initial signals;
the processing rate R and the first sample rate R are equal; and
the second sample rate N times R is greater or equal to a total bandwidth comprising the transmission frequencies of the two or more initial signals.

21. A wireless communication device comprising a digital pre-distortion arrangement, wherein the digital pre-distortion arrangement comprises:
a respective filter bank for each of two or more initial signals to be amplified simultaneously by a non-linear power amplifier, wherein each respective filter bank comprises N interrelated filters and is configured to filter the initial signal in each of the interrelated filters to produce N digital filtered signals, N being an integer greater than 1, wherein the initial signal and each of the digital filtered signals have a first sample rate R and wherein multiplexed impulse responses of the interrelated filters of the respective filter bank define an overall filter function comprising a pass band associated with a transmission frequency of the initial signal;
N combiners, each configured to combine corresponding digital filtered signals of each of the two or more initial signals to produce a composite digital signal having the first sample rate R;
N pre-distorters, each configured to apply digital pre-distortion at a processing rate R to a respective one of the composite digital signals to produce a pre-distorted composite digital signal having the first sample rate R; and
a multiplexer configured to multiplex the N pre-distorted composite digital signals to produce a pre-distorted digital signal having a second sample rate N times R;
wherein:
the pre-distorted digital signal comprises a signal component of each of the two or more initial signals;
the processing rate R and the first sample rate R are equal; and
the second sample rate N times R is greater or equal to a total bandwidth comprising the transmission frequencies of the two or more initial signals.

22. A digital pre-distortion adaption method comprising:
  delaying two or more initial signals to be amplified simultaneously by a non-linear power amplifier to produce delayed initial signals, wherein each of the initial signals has a sample rate R;
  mixing each of the delayed initial signals with a respective feedback positioning frequency to produce respective frequency shifted delayed initial signals;
  combining the respective frequency shifted delayed initial signals to produce a composite reference signal;
  for each transmission frequency of the two or more initial signals, filtering a digital feedback signal with a respective receiver filter to produce a filtered feedback signal, wherein the digital feedback signal represents a pre-distorted digital signal influenced by the non-linear power amplifier, and mixing the filtered feedback signal with the respective feedback positioning frequency to produce a frequency shifted baseband feedback signal;
  combining the frequency shifted baseband feedback signals to produce a composite feedback signal;
  comparing the composite reference signal with the composite feedback signal to produce a pre-distortion error estimation; and
  adapting the digital pre-distortion based on the pre-distortion error estimation.

23. A digital pre-distortion adaption arrangement comprising:
  one or more delay elements configured to delay each of two or more initial signals to be amplified simultaneously by a non-linear power amplifier to produce delayed initial signals, wherein each of the initial signals has a sample rate R;
  an adaptor circuit configured to compare the delayed initial signals with a digital feedback signal to produce a pre-distortion error estimation, wherein the digital feedback signal represents a pre-distorted digital signal influenced by the non-linear power amplifier, the adaptor circuit comprising:
    a mixer for each of the two or more initial signals configured to mix the delayed initial signal with a respective feedback positioning frequency to produce a respective frequency shifted delayed initial signal;
    a combiner configured to combine the respective frequency shifted delayed initial signals to produce a composite reference signal;
    a respective receive filter for each of the two or more initial signals, the respective filter having a pass band associated with the transmission frequency of the initial signal and configured to filter the digital feedback signal to produce a respective filtered feedback signal;
    a mixer for each of the two or more initial signals configured to mix the filtered feedback signal with the respective feedback positioning frequency to produce a frequency shifted baseband feedback signal;
    a combiner configured to combine the frequency shifted baseband feedback signals to produce a composite feedback signal; and
    a comparator configured to compare the composite reference signal with the composite feedback signal to produce the pre-distortion error estimation;
  wherein the adaptor circuit is further adapted to adapt the digital pre-distortion based on the pre-distortion error estimation.

24. A transmitter comprising a digital pre-distortion adaptation arrangement, wherein the digital pre-distortion adaption arrangement comprises:
  one or more delay elements configured to delay each of two or more initial signals to be amplified simultaneously by a non-linear power amplifier to produce delayed initial signals, wherein each of the initial signals has a sample rate R;
  an adaptor circuit configured to compare the delayed initial signals with a digital feedback signal to produce a pre-distortion error estimation, wherein the digital feedback signal represents a pre-distorted digital signal influenced by the non-linear power amplifier, the adaptor circuit comprising:
    a mixer for each of the two or more initial signals configured to mix the delayed initial signal with a respective feedback positioning frequency to produce a respective frequency shifted delayed initial signal;
    a combiner configured to combine the respective frequency shifted delayed initial signals to produce a composite reference signal;
    a respective receive filter for each of the two or more initial signals, the respective filter having a pass band associated with the transmission frequency of the initial signal and configured to filter the digital feedback signal to produce a respective filtered feedback signal;
    a mixer for each of the two or more initial signals configured to mix the filtered feedback signal with the respective feedback positioning frequency to produce a frequency shifted baseband feedback signal;
    a combiner configured to combine the frequency shifted baseband feedback signals to produce a composite feedback signal; and
    a comparator configured to compare the composite reference signal with the composite feedback signal to produce the pre-distortion error estimation;
  wherein the adaptor circuit is further adapted to adapt the digital pre-distortion based on the pre-distortion error estimation.

25. A wireless communication device comprising a digital pre-distortion adaptation arrangement, wherein the digital pre-distortion adaption arrangement comprises:
  one or more delay elements configured to delay each of two or more initial signals to be amplified simultaneously by a non-linear power amplifier to produce delayed initial signals, wherein each of the initial signals has a sample rate R;
  an adaptor circuit configured to compare the delayed initial signals with a digital feedback signal to produce a pre-distortion error estimation, wherein the digital feedback signal represents a pre-distorted digital signal influenced by the non-linear power amplifier, the adaptor circuit comprising:
    a mixer for each of the two or more initial signals configured to mix the delayed initial signal with a respective feedback positioning frequency to produce a respective frequency shifted delayed initial signal;
    a combiner configured to combine the respective frequency shifted delayed initial signals to produce a composite reference signal;
    a respective receive filter for each of the two or more initial signals, the respective filter having a pass band associated with the transmission frequency of the initial signal and configured to filter the digital feedback signal to produce a respective filtered feedback signal;
    a mixer for each of the two or more initial signals configured to mix the filtered feedback signal with the respective feedback positioning frequency to produce a frequency shifted baseband feedback signal;

a combiner configured to combine the frequency shifted baseband feedback signals to produce a composite feedback signal; and a comparator configured to compare the composite reference signal with the composite feedback signal to produce the pre-distortion error estimation;

wherein the adaptor circuit is further adapted to adapt the digital pre-distortion based on the pre-distortion error estimation.

\* \* \* \* \*